US009552775B2

(12) United States Patent
Koyama

(10) Patent No.: US 9,552,775 B2
(45) Date of Patent: Jan. 24, 2017

(54) ELECTRO-OPTICAL DEVICE AND DRIVING METHOD OF THE SAME

(75) Inventor: Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 386 days.

(21) Appl. No.: 12/763,244

(22) Filed: Apr. 20, 2010

(65) Prior Publication Data

US 2010/0201660 A1 Aug. 12, 2010

Related U.S. Application Data

(63) Continuation of application No. 11/551,351, filed on Oct. 20, 2006, now Pat. No. 7,724,217, which is a (Continued)

(30) Foreign Application Priority Data

Aug. 8, 2000 (JP) ................................ 2000-240324

(51) Int. Cl.
*G09G 3/30* (2006.01)
*G09G 3/32* (2016.01)
(Continued)

(52) U.S. Cl.
CPC .......... *G09G 3/3275* (2013.01); *G09G 3/2022* (2013.01); *G09G 2300/0809* (2013.01); (Continued)

(58) Field of Classification Search
CPC ............... G09F 3/30; G09G 3/32; G09G 3/36; G09G 3/3611; G09G 3/3648
(Continued)

(56) References Cited

U.S. PATENT DOCUMENTS 4,432,610 A 2/1984 Kobayashi et al.
4,752,118 A 6/1988 Johnson
(Continued)

FOREIGN PATENT DOCUMENTS

EP 0 365 445 A2 4/1990
EP 999595 A3 5/2000
(Continued)

OTHER PUBLICATIONS

Baldo et al.; "Highly efficient phosphorescent emission from organic electroluminescent devices"; Nature, vol. 395; Sep. 10, 1998, pp. 151-154.

(Continued)

*Primary Examiner* — Jason Olson
*Assistant Examiner* — Sosina Abebe
(74) *Attorney, Agent, or Firm* — Fish & Richardson P.C.

(57) ABSTRACT

In the electro-optical device for carrying out an image display by using n-bit (n is a natural number) digital image signals, one pixel incorporates n×m (m is a natural number) memory circuits, and has a function to store the digital image signals for m frames in the pixel (in examples shown in the drawings, n=3, m=2, and memory circuits A1 to A3 and B1 to B3 store signals for 3 bits×2 frames). Thus, in the display of a still picture, the digital image signals once stored in the memory circuits are repeatedly read out and a display is carried out for each frame, so that driving of a source signal line driver circuit is stopped during the display. Thus, the electric power consumption of the electro-optical device is reduced.

15 Claims, 21 Drawing Sheets

Related U.S. Application Data continuation of application No. 09/912,596, filed on Jul. 26, 2001, now Pat. No. 7,151,511.

(51) Int. Cl.
*G09G 3/20* (2006.01)
*H01L 27/32* (2006.01)

(52) U.S. Cl.
CPC ............... *G09G 2300/0842* (2013.01); *G09G 2300/0857* (2013.01); *G09G 2300/0861* (2013.01); *G09G 2310/027* (2013.01); *G09G 2310/0294* (2013.01); *H01L 27/32* (2013.01)

(58) Field of Classification Search
USPC .......................... 345/45, 76, 87, 90, 98, 204
See application file for complete search history.

(56) References Cited

U.S. PATENT DOCUMENTS 4,773,738 A 9/1988 Hayakawa et al.
4,996,523 A 2/1991 Bell et al.
5,091,722 A 2/1992 Kitajima et al.
5,125,045 A 6/1992 Murakami et al.
5,200,846 A 4/1993 Hiroki et al.
5,225,823 A 7/1993 Kanaly
5,247,190 A 9/1993 Friend et al.
5,339,090 A 8/1994 Crossland et al.
5,349,366 A 9/1994 Yamazaki et al.
5,424,752 A 6/1995 Yamazaki et al.
5,471,225 A 11/1995 Parks
5,479,283 A 12/1995 Kaneko et al.
5,600,169 A 2/1997 Burgener et al.
5,608,549 A 3/1997 Usami
5,631,741 A * 5/1997 Matthews ..................... 358/296
5,642,129 A 6/1997 Zavracky et al.
5,673,422 A 9/1997 Kawai et al.
5,699,078 A * 12/1997 Yamazaki ............ G09G 3/2018 345/89
5,712,652 A 1/1998 Sato et al.
5,771,031 A 6/1998 Kinoshita et al.
5,793,344 A 8/1998 Koyama
5,798,746 A * 8/1998 Koyama ......................... 345/98
5,844,538 A 12/1998 Shiraki et al.
5,854,628 A 12/1998 Nakagawa
5,900,856 A * 5/1999 Iino et al. ..................... 345/100
5,907,313 A 5/1999 Kubota et al.
5,945,866 A 8/1999 Fonash et al.
5,945,972 A * 8/1999 Okumura et al. .............. 345/98
5,959,598 A 9/1999 McKnight
5,990,629 A * 11/1999 Yamada ............... G09G 3/2011 315/169.3
5,995,072 A * 11/1999 Nakajima ....................... 345/87
6,040,815 A * 3/2000 Erhart et al. .................... 345/98
6,100,879 A * 8/2000 Da Costa ...................... 345/211
6,115,019 A 9/2000 Perner
6,165,824 A 12/2000 Takano et al.
6,175,351 B1 1/2001 Matsuura et al.
6,175,922 B1 * 1/2001 Wang ............................ 713/182
6,181,314 B1 * 1/2001 Nakajima et al. ............ 345/100
6,229,506 B1 * 5/2001 Dawson ............... G09G 3/3233 345/82
6,246,386 B1 6/2001 Perner
6,259,846 B1 7/2001 Roach et al.
6,274,887 B1 8/2001 Yamazaki et al.
6,320,562 B1 * 11/2001 Ueno .................. G09G 3/3625 345/87
6,333,737 B1 12/2001 Nakajima
6,344,672 B2 2/2002 Huffman
6,344,843 B1 2/2002 Koyama et al.
6,356,028 B1 3/2002 Legagneux et al.
6,366,026 B1 4/2002 Saito et al.
6,384,818 B1 5/2002 Yamazaki et al.
6,392,618 B1 5/2002 Kimura
6,429,844 B1 * 8/2002 Yoon .................... G09G 3/2011 345/98
6,441,829 B1 8/2002 Blalock et al.
6,456,267 B1 9/2002 Sato et al.
6,534,864 B1 3/2003 Tanaka et al.
6,535,192 B1 3/2003 Sung et al.
6,545,654 B2 4/2003 Jacobsen et al.
6,545,708 B1 4/2003 Tamayama et al.
6,549,196 B1 4/2003 Taguchi et al.
6,556,176 B1 4/2003 Okuyama et al.
6,563,480 B1 * 5/2003 Nakamura ...................... 345/82
6,564,237 B2 5/2003 Ohashi et al.
6,594,505 B1 * 7/2003 Ishii ........................... 455/552.1
6,597,349 B1 * 7/2003 Koyama .............. G09G 3/3688 345/204
6,630,916 B1 10/2003 Shinoda
6,636,194 B2 10/2003 Ishii
6,670,938 B1 12/2003 Yoshida
6,683,596 B2 1/2004 Ozawa
6,731,264 B2 5/2004 Koyama et al.
6,738,054 B1 5/2004 Yamaguchi
6,747,623 B2 6/2004 Koyama
6,750,836 B1 6/2004 Katayama et al.
6,765,562 B2 7/2004 Yamazaki et al.
6,774,876 B2 8/2004 Inukai
6,992,652 B2 1/2006 Koyama
7,129,918 B2 10/2006 Kimura
7,250,927 B2 7/2007 Yamazaki et al.
7,417,613 B2 8/2008 Koyama
2001/0005193 A1 6/2001 Yokoyama
2001/0033323 A1 10/2001 Otose et al.
2002/0000969 A1 1/2002 Ozawa
2002/0003521 A1 1/2002 Matsueda et al.
2002/0021274 A1 2/2002 Koyama et al.
2002/0021295 A1 2/2002 Koyama et al.
2002/0024054 A1 2/2002 Koyama et al.
2002/0024485 A1 2/2002 Koyama
2002/0036604 A1 3/2002 Yamazaki et al.
2002/0039087 A1 4/2002 Inukai
2002/0041266 A1 4/2002 Koyama et al.
2002/0057244 A1 5/2002 Koyama et al.
2002/0089483 A1 7/2002 Yamazaki et al.
2002/0113763 A1 8/2002 Koyama
2002/0118029 A1 8/2002 Yamasaka
2002/0130828 A1 9/2002 Yamazaki et al.
2003/0067632 A1 4/2003 Ohta et al.
2003/0071772 A1 4/2003 Kimura
2003/0075755 A1 * 4/2003 Yamazaki ..................... 257/315
2003/0098875 A1 5/2003 Kurokawa et al.
2003/0103025 A1 6/2003 Kurokawa et al.
2004/0164322 A1 8/2004 Kondo et al.
2004/0183766 A1 9/2004 Koyama et al.
2004/0222955 A1 11/2004 Koyama
2008/0024399 A1 1/2008 Yamazaki et al.

FOREIGN PATENT DOCUMENTS

EP 1098290 A3 5/2001
EP 1 182 636 A2 2/2002
JP 02-148687 A 6/1990
JP 04350627 B2 12/1992
JP 6102530 B 4/1994
JP 7092935 A 4/1995
JP 7199149 A 8/1995
JP 8101609 A 4/1996
JP 8194205 A 7/1996
JP 8286170 A 11/1996
JP 9212140 A 8/1997
JP 10092576 A 4/1998
JP 10-214060 A 8/1998
JP 10214060 A 8/1998
JP 10228012 A 8/1998
JP 10232649 A 9/1998
JP 10247735 A 9/1998
JP 10253941 A 9/1998
JP 10312173 A 11/1998
JP 11002797 A 1/1999
JP 11064814 A 3/1999

(56) References Cited

FOREIGN PATENT DOCUMENTS

| | | |
|---|---|---|
| JP | 2000-183187 A | 6/2000 |
| JP | 2000-200838 A | 7/2000 |
| JP | 2002-140034 A | 5/2002 |

OTHER PUBLICATIONS

Baldo et al.; "Very high-efficiency green organic light-emitting devices based on electrophosphorescence"; Applied Physics Letters, vol. 75, No. 1; Jul. 5, 1999, pp. 4-6.
Han et al.; "Green OLED with Low Temperature Poly Si TFT"; Euro Display Late-news Papers; pp. 27-30; Sep. 1999.
Koyama et al., "A 4.0-in. Poly Si TFT-LCD with Integrated 6-bit Digital Data Driver Using CGS Technology", Digest of Technical Papers—AM-LCD '99, pp. 29-32, Jul. 14-16, 1999.
Office Action (U.S. Appl. No. 09/916,306), Jan. 25, 2005, 15 pages.
Schenk et al., "Polymers for Light Emitting Diodes", Euro Display '99, Sep. 6-9, 1999, pp. 33-37.
Shimoda et al.; "Current Status and Future of Light-Emitting Polymer Display Driven by Poly-Si TFT"; SID 99 Digest; pp. 372-375; 1999.
Shimoda et al.; "High Resolution Light Emitting Polymer Display Driven by Low Temperature Polysilicon Thin Film Transistor With Integrated Driver"; Asia Display 98; pp. 217-220.
Tetsuo Tsutsui et al.; "Electroluminescence in Organic Thin Films"; Photochemical Processes in Organized Molecular Systems; Sep. 22, 1990, pp. 437-450.
Tetsuo Tsutsui et al.; "High Quantum Efficiency in Organic Light-Emitting Devices with Iridium-Complex as a Triplet Emissive Center"; Japan Journal of Applied Science; Dec. 15, 1999, vol. 38, Part 2, No. 12B, pp. L1502-L1504.
Office Action (KR Application No. 2001-0047640) mailed Aug. 30, 2007 with translation, 10 pages.

* cited by examiner 5001
5002
5002a
5002b
5003
5004
5005
5006
5007
5008
5009

5010
5011
5011a
5011b
5012
5012a
5012b
5013
5013a
5013b
5014
5014a
5014b
5015
5015a
5015b
5016
5016a
5016b
5017
5018
5019
5020
5021
5022
5023
5024
5025

5026
5026a
5026b
5027
5027a
5027b
5028
5028a
5028b
5029
5029a
5029b
5030
5030a
5030b
5031
5031a
5031b 5032
5033
5034
5035
5036

5037
5037a
5037b
5032b
5032a
5038
5038a
5038b
5033a
5033b
5042
5042a
5042b
5039
5039a
5039b
5034a
5034b
5035a
5035b
5040
5040a
5040b
5036a
5036b
5041
5041a
5041b 5200
5043
5044
5045
5046
5047
5048

1 second
1
2
3
4
59
60
1 frame period

Ta1
Ts1
Ta2
Ts2
Ta3
Ts3
SF1
SF2
SF3 address period
1 sub-frame period
sustain period
1
2
3
4
479
480

1 horizontal period
1
2
3
4
639
640
dot data sampling period
line data latch period

ELECTRO-OPTICAL DEVICE AND DRIVING METHOD OF THE SAME

CROSS-REFERENCE TO RELATED APPLICATIONS

This application is a continuation of U.S. application Ser. No. 11/551,351, filed Oct. 20, 2006, now allowed, which is a continuation of U.S. application Ser. No. 09/912,596, filed Jul. 26, 2001, now U.S. Pat. No. 7,151,511, which claims the benefit of a foreign priority application filed in Japan as Serial No. 2000-240324 on Aug. 8, 2000, all of which are incorporated by reference.

BACKGROUND OF THE INVENTION

1. Field of the Invention

The present invention relates to a driver circuit of an electro-optical device and the electro-optical device using the driver circuit, and particularly to a driver circuit of an active matrix type electro-optical device including thin film transistors formed on an insulator and the active matrix type electro-optical device using the driver circuit. More particularly, the invention relates to a driver circuit of an active matrix type electro-optical device using a digital image signal as an image source and using a self-luminous element, such as an organic electro-luminescence (EL) element, as a pixel portion, and the active matrix type electro-optical device using the driver circuit.

2. Description of the Related Art

An EL element includes a layer (hereinafter referred to as an EL layer) containing an organic compound in which electro-luminescence (Electro Luminescence: luminescence generated when an electric filed is applied) is obtained, an anode, and a cathode. The luminescence in the organic compound includes light emission (fluorescence) at the time when a singlet excitation state returns to a ground state and light emission (phosphorescence) at the time when a triplet excitation state returns to the ground state, and the present invention can be applied to an electro-optical device using either light emission.

Incidentally, in the present specification, any layer provided between an anode and a cathode is defined as an EL layer. Specifically, the EL layer includes a light emitting layer, a hole injection layer, an electron injection layer, a hole transfer layer, an electron transfer layer, and the like. The EL element basically has a structure in which an anode/a light emitting layer/a cathode are successively laminated, and in addition to this structure, the EL element may have a structure in which an anode/a hole injection layer/a light emitting layer/a cathode or an anode/a hole injection layer/a light emitting layer/an electron transfer layer a cathode are successively laminated.

Besides, in the present specification, an element formed of an anode, an EL layer, and a cathode is called an EL element.

In recent years, an electro-optical device in which a semiconductor thin film is formed on an insulator, especially on a glass substrate, in particular an active matrix type electro-optical device using thin film transistors (hereinafter referred to as TFTs) has become remarkably popular. The active matrix type electro-optical device using the TFTs includes hundreds of thousands to millions of TFTs arranged in matrix form, and displays an image by controlling an electric charge of each pixel.

Further, as a recent technique, a technique relating to a polysilicon TFT in which a driver circuit is simultaneously formed at a peripheral portion of a pixel portion by using TFTs in addition to pixel TFTs constituting pixels has been developed, and greatly contributes to miniaturization of a device and reduction in electric power consumption, and accordingly, the electro-optical device has become an indispensable device for a display portion of a mobile instrument the application field of which is remarkably enlarged in recent years, and so on.

Besides, as a flat panel display replacing an LCD (Liquid Crystal Display), an electro-optical device using a self-luminous material such as organic EL has attracted attention, and active research has been carried out.

FIG. 13 is a schematic view of an example of a digital system electro-optical device. A pixel portion 1307 is arranged at the center. In the pixel portion, a current supply line 1306 for supplying electric current to EL elements is arranged in addition to source signal lines and gate signal lines. A source signal line driver circuit 1301 for controlling the source signal lines is arranged at the upper side of the pixel portion. The source signal line driver circuit 1301 includes a shift register circuit 1303, a first latch circuit 1304, a second latch circuit 1305, and the like. Gate signal line driver circuits 1302 for controlling the gate signal lines are arranged at both sides of the pixel portion. Note that, in FIG. 13, although the gate signal line driver circuits 1302 are arranged at both sides of the pixel portion, they may be arranged at one side. However, the arrangement at both sides is desirable in view of driving efficiency and driving reliability.

The source signal line driver circuit 1301 has a structure as shown in FIG. 14, and includes shift register circuits (SR) 1401, first latch circuits (LAT 1) 1402, second latch circuits (LAT 2) 1403, and the like. Note that, although not shown in FIG. 14, a buffer circuit, a level shifter circuit, and the like may be arranged as the need arises.

The operation will be described in brief with reference to FIGS. 13 and 14. First, clock signals (S-CLK, S-CLKb) and a start pulse (S-SP) are inputted to the shift register circuit 1303 (expressed as SR in FIG. 14), and a sampling pulse is sequentially outputted. Subsequently, the sampling pulse is inputted to the first latch circuit 1304 (expressed as LAT 1 in FIG. 14), and digital image signals (Digital Data) inputted to the same first latch circuit 1304 are respectively held. This period is called a dot data sampling period. Here, D1 is the most significant bit (MSB) and D3 is the least significant bit (LSB). In the first latch circuit 1304, when holding of the digital image signals for one bit in one horizontal period is completed, the digital image signals held in the first latch circuit 1304 are transferred in the retrace period to the second latch circuit 1305 (expressed as LAT 2 in FIG. 14) all at once in accordance with the input of a latch signal (Latch Pulse). A period in which the digital image signals are transferred from the first latch circuit to the second latch circuit is called a line data latch period.

On the other hand, in the gate signal line side driver circuits 1302, a gate side clock signal (G-CLK) and a gate side start pulse (G-SP) are inputted to shift registers (not shown). On the basis of the input signals, the shift registers sequentially output pulses, which are outputted as gate signal line selection pulses via buffers or the like (not shown), and the gate signal lines are sequentially selected.

The data transferred to the second latch circuit 1305 of the source signal line side driver circuit 1301 are written into the pixels at the row selected by the gate signal line selection pulse.

Subsequently, driving of the pixel portion 1307 will be described. FIGS. 19A and 19B show part of the pixel portion 1307 of FIG. 13. FIG. 19A shows a matrix of 3×3 pixels. A portion surrounded by a dotted line frame 1900 is one pixel, and FIG. 19B is an enlarged view thereof. In FIG. 19B, reference numeral 1901 designates a TFT (hereinafter referred to as a switching TFT) functioning as a switching element when a signal is written into the pixel. Any polarity of an N-channel type and a P-channel type may be used for the switching TFT 1901. Reference numeral 1902 designates a TFT (hereinafter referred to as an EL driving TFT) functioning as an element (current control element) for controlling electric current to an EL element 1903. In the case where the P-channel type is used for the EL driving TFT 1902, it is arranged between an anode 1909 of the EL element 1903 and a current supply line 1907. As another constitution method, the N-channel type is used for the EL driving TFT 1902, and it can also be arranged between a cathode 1910 of the EL element 1903 and a cathode electrode 1908. However, since the grounded source is excellent for the operation of a TFT, and from the restriction in manufacture of the EL element 1903, a system is general in which the P-channel type is used for the EL driving TFT 1902, and the EL driving TFT 1902 is arranged between the anode 1909 of the EL element 1903 and the current supply line 1907, and is often adopted. Reference numeral 1904 designates a storage capacitor for holding a signal (voltage) inputted from a source signal line 1906. Although one terminal of the storage capacitor 1904 in FIG. 19B is connected to the current supply line 1907, there is also a case where a dedicated wiring line is used. A gate electrode of the switching TFT 1901 is connected to a gate signal line 1905, and a source region thereof is connected to the source signal line 1906.

Next, the operation of a circuit of an active matrix type electro-optical device will be described with reference to FIGS. 19A and 19B. First, when the gate signal line 1905 is selected, a voltage is applied to the gate electrode of the switching TFT 1901, and the switching TFT 1901 comes to have a conductive state. Then, the signal (voltage) of the source signal line 1906 is stored in the storage capacitor 1904. Since the voltage of the storage capacitor 1904 becomes a voltage $V_{GS}$ between the gate and source of the EL driving TFT 1902, a current corresponding to the voltage of the storage capacitor 1904 flows through the EL driving TFT 1902 and the EL element 1903. As a result, the EL element 1903 lights up.

The brightness of the EL element 1903, that is, the amount of current flowing through the EL element 1903 can be controlled by the voltage $V_{GS}$ of the EL driving TFT 1902. The voltage $V_{GS}$ is the voltage of the storage capacitor 1904, and is the signal (voltage) inputted to the source signal line 1906. That is, by controlling the signal (voltage) inputted to the source signal line 1906, the brightness of the EL element 1903 is controlled. Finally, the gate signal line 1905 is made to have the non-selected state, the gate of the switching TFT 1901 is closed, and the switching TFT 1901 is made to have the off state. At that time, the electric charge stored in the storage capacitor 1904 is held. Thus, the voltage $V_{GS}$ of the EL driving TFT 1902 is held as it is, and the current corresponding to the voltage $V_{GS}$ continues flowing through the EL driving TFT 1902 to the EL element 1903.

The driving of the EL element and so on is reported in SID99 Digest: P372: "Current Status and future of Light-Emitting Polymer Display Driven by Poly-Si TFT", ASIA DISPLAY98: P217: "High Resolution Light Emitting Polymer Display Driven by Low Temperature Polysilicon Thin Film Transistor with Integrated Driver", Euro Display99 Late News: P27: "3.8 Green OLED with Low Temperature Poly-Si TFT", and the like.

Next, a system of a gradation display of an EL element will be described. An analog gradation system has a defect that it is easily affected by the fluctuation of current characteristics of EL driving TFTs. That is, when the current characteristic of an EL driving TFT becomes different, even if the same gate voltage is applied, the value of a current flowing through the EL driving TFT and the EL element is varied. As a result, the lightness of the EL element, that is, the gradation is changed.

Then, in order to reduce the influence of the fluctuation of the characteristics of the EL driving TFTs, a system called a digital gradation system has been devised. This system is such that the gradation is controlled in two states of a state (little current flows) in which the absolute value $|V_{GS}|$ of the gate voltage of the EL driving TFT is not larger than a lighting start voltage, and a state (current close to the maximum flows) in which it is larger than a brightness saturation voltage. In this case, when the absolute value $|V_{GS}|$ of the gate voltage of the EL driving TFT is made sufficiently larger than the brightness saturation voltage, even if the current characteristics of the EL driving TFTs fluctuate, the current value approaches $I_{MAX}$. Thus, the influence of the fluctuation of the EL driving TFTs can be made very small. As described above, since the gradation is controlled in the two states of the ON state (clear since maximum current flows) and the OFF state (dark since current does not flow), this system is called the digital gradation system.

However, in the case of the digital gradation system, if any change is not made, only two gradations can be displayed. Then, several techniques for realizing multiple gradations in combination with another system are proposed.

As one of the systems for realizing the multiple gradations, there is a time gradation system. The time gradation system is such a system that a time when an EL element lights up is controlled and the gradation is realized by the length of the lighting time. That is, one frame period is divided into a plurality of sub-frame periods, and the number and lengths of lighting subframes are controlled, so that the gradation is expressed.

Reference will be made to FIGS. 20A to 20D. FIGS. 20A to 20D show the driving timing of a circuit using the time gradation system in brief. In this example, a frame frequency is set to 60 Hz and 3-bit gradations are obtained by the time gradation system in the electro-optical device of VGA (640×480 pixels) standard. A circuit in FIG. 14 is used as a source signal line driver circuit.

In general, images are drawn to a screen of the electro-optical device sixty times per second. By this way, the images can be displayed without flickering (blinking) to human eyes. A period in which one image is drawn to the screen is called as one frame period.

As shown in FIG. 20A, one frame is divided into sub-frame periods the number of which is the number of gradation bits. Here, since 3 bits are used, one frame period is divided into three sub-frame periods. One sub-frame period is further divided into an address period (Ta) and a sustain (display) period (Ts) (FIG. 20B). A sustain period in $SF_1$ will be referred to as $Ts_1$. Also in the cases of $SF_2$ and $SF_3$, similarly, the sustain periods will be referred to as $Ts_2$ and $Ts_3$. Since the address period is a period in which image signals for one frame are written in pixels, the lengths in any sub-frame periods are equal to one another (FIG. 20C). Here, the sustain periods have a ratio of the powers of 2, such as $Ts_1:Ts_2:Ts_3=2^2:2^1:2^0=4:2:1$.

In the address period, gate signal lines are sequentially selected from first row line, and digital image data are written to the pixels. Since VGA (640×480 pixels) standard is shown in FIG. 20C, the digital image signals are written into 480 rows. Here, processing period for one row is shown as one horizontal period.

Further, in the one horizontal period, sampling pulses are sequentially outputted from the shift register (SR) circuit in accordance with clock pulses (S-CLK, S-CLKb) and start pulses (SP), and the digital image signals are processed. This period is called as a dot data sampling period. In the VGA standard electro-optical device, there are 640 pixels in one row, the digital image signals are processed for the 640 pixels.

After the digital signals are processed for one row (640 pixels), a latch pulse is inputted in a retrace period, and the digital signals held in first latch circuits (LAT1) is transferred at once to second latch circuits (LAT2) and after that, digital image signals of one row are written into corresponding pixels simultaneously.

As a method of a gradation display, in the sustain (display) periods from $Ts_1$ to $Ts_3$, the EL element is controlled to have either a lighting state or a non-lighting state, so that the brightness is controlled by the length of the total lighting time in one frame period. In this example, since $2^3=8$ lengths of lighting times can be determined by the combination of lighting sustain (display) periods, 8 gradations can be displayed. Like this, a gradation display is carried out by using the length of the lighting time.

In the case where the number of gradations is further increased, the number of partitions of one frame period has only to be increased. In the case where one frame period is divided into n sub-frames, the ratio of lengths of the sustain (display) periods becomes $Ts_1:Ts_2: \ldots Ts_{(n-1)}:Ts_n=2^{(n-1)}:2^{(n-2)}: \ldots 2^1:2^0$, and $2^n$ gradations can be expressed.

In a general active matrix type electro-optical device, in order to smoothly display a motion picture, as shown in FIG. 20A, a renewal of a screen display is carried out about 60 times per second. That is, it is necessary that digital image signals are supplied for every frame, and writing into pixels is carried out each time. Even if the image is a still picture, since the same signals must continue to be supplied for every frame, the driver circuit must continuously carry out the repetitive processing of the same digital image signals.

Although there is a method in which digital image signals of a still picture are once written in an external memory circuit, and thereafter, the digital image signals are supplied to the electro-optical device from the external memory circuit for every frame, in any case, there is no change in that the external memory circuit and the driver circuit must continue to operate.

Especially in a mobile instrument, reduction in electric power consumption is greatly desired. Further, in the mobile instrument, in spite of the fact that it is mostly used in a still picture mode, since the driver circuit continues to operate even at the time of a still picture display as described above, this is an obstacle to the reduction in electric power consumption.

SUMMARY OF THE INVENTION

In view of the foregoing problems, the present invention has an object to reduce the electric power consumption of a driver circuit at the time of a display of a still picture by using a novel circuit.

In order to achieve the object, the present invention uses the following means.

A plurality of memory circuits are arranged in a pixel, and digital image signals are stored in each pixel. In the case of a still picture, when writing is once carried out, thereafter, since information written in the pixel is the same, even if signals are not inputted for each frame, the still picture can be continuously displayed by reading out the signals stored in the memory circuits. That is, when the still picture is displayed, after a processing operation of signals of at least one frame is carried out, it becomes possible to stop a source signal line driver circuit, and accordingly, it becomes possible to greatly reduce electric power consumption.

Hereinafter, structures of an electro-optical device of the present invention will be described.

According to a first aspect of the present invention, an electro-optical device having a plurality of pixels is characterized in that each of the plurality of pixels includes a plurality of memory circuits.

According to a second aspect of the present invention, an electro-optical device having a plurality of pixels is characterized in that each of the plurality of pixels includes n×m memory circuits for storing n-bit (n is a natural number, 2≤n) digital image signals for m frames (m is a natural number, 1≤m).

According to a third aspect of the present invention, an electro-optical device having a plurality of pixels is characterized in that:

each of the plurality of pixels includes a source signal line, n (n is a natural number, 2≤n) writing gate signal lines, n reading gate signal lines, n writing transistors, n reading transistors, n×m memory circuits for storing n-bit digital image signals for m frames (m is a natural number, 1≤m), n writing memory circuit selection portions, n reading memory circuit selection portions, a current supply line, an EL driving transistor, and an EL element;

each of gate electrodes of the n writing transistors is electrically connected to any different one of the n writing gate signal lines, one of a source region and a drain region is electrically connected to the source signal line, the other is electrically connected to any different one signal input portion of the n writing memory circuit selection portions;

each of the n writing memory circuit selection portions includes m signal output portions, the m signal output portions are respectively electrically connected to signal input portions of the different in memory circuits;

each of the n reading memory circuit selection portions includes m signal input portions, the m signal input portions are respectively electrically connected to signal output portions of the different m memory circuits;

each of gate electrodes of the n reading transistors is electrically connected to any different one of the n reading gate signal lines, one of a source region and a drain region is electrically connected to any different one signal output portion of the n reading memory circuit selection portions, the other is electrically connected to a gate electrode of the EL driving transistor, one of a source region and a drain region of the EL driving transistor is electrically connected to the current supply line, and the other is electrically connected to one electrode of the EL element.

According to a fourth aspect of the present invention, an electro-optical device having a plurality of pixels is characterized in that:

each of the plurality of pixels includes n (n is a natural number, 2≤n) source signal lines, a writing gate signal line, n reading gate signal lines, n writing transistors, n reading transistors, n×m memory circuits for storing n-bit digital image signals for m frames (m is a natural number, 1≤m), n writing memory circuit selection portions, n reading memory circuit selection portions, a current supply line, an EL driving transistor, and an EL element;

each of gate electrodes of the n writing transistors is electrically connected to the writing gate signal line, one of a source region and a drain region is electrically connected to any different one of the n source signal lines, the other is electrically connected to any different one signal input portion of the n writing memory circuit selection portions;

each of the n writing memory circuit selection portions includes m signal output portions, the m signal output portions are respectively electrically connected to signal input portions of the different m memory circuits;

each of the n reading memory circuit selection portions includes m signal input portions, the m signal input portions are respectively electrically connected to signal output portions of the different m memory circuits;

each of gate electrodes of the n reading transistors is electrically connected to any different one of the n reading gate signal lines, one of a source region and a drain region is electrically connected to any different one signal output portion of the n reading memory circuit selection portions, the other is electrically connected to a gate electrode of the EL driving transistor, one of a source region and a drain region of the EL driving transistor is electrically connected to the current supply line, and the other is electrically connected to one electrode of the EL element.

According to a fifth aspect of the present invention, in the third or fourth aspect of the invention, the electro-optical device is characterized in that:

each of the writing memory circuit selection portions selects any one of the m memory circuits, and is electrically connected to one of the source region and the drain region of the writing transistor to write the digital image signal into the memory circuit; and each of the reading memory circuit selection portions selects any one of the memory circuits in which the digital image signal is stored, and is electrically connected to one of the source region and the drain region of the reading transistor to read out the stored digital image.

According to a sixth aspect of the present invention, in the third aspect of the invention, the electro-optical device is characterized by further comprising:

shift registers for sequentially outputting sampling pulses in accordance with a clock signal and a start pulse;

first latch circuits for holding the n-bit (n is a natural number, 2≤n) digital image signals in accordance with the sampling pulses;

second latch circuits to which the n-bit digital image signals held in the first latch circuits are transferred; and bit signal selection switches for sequentially selecting the n-bit digital image signals transferred to the second latch circuits for each bit and for outputting them to the source signal line.

According to a seventh aspect of the present invention, in the fourth aspect of the invention, the electro-optical device is characterized by further comprising:

shift registers for sequentially outputting sampling pulses in accordance with a clock signal and a start pulse;

first latch circuits for holding 1-bit digital image signals of the n-bit (n is a natural number, 2≤n) digital image signals in accordance with the sampling pulses; and second latch circuits to which the 1-bit digital image signals held in the first latch circuits are transferred and which output the 1-bit digital image signals to the source signal lines.

According to an eighth aspect of the present invention, in the fourth aspect of the invention, the electro-optical device is characterized by further comprising:

shift registers for sequentially outputting sampling pulses in accordance with a clock signal and a start pulse; and first latch circuits for holding 1-bit digital image signals of the n-bit (n is a natural number, 2≤n) digital image signals in accordance with the sampling pulses and for outputting the 1-bit digital image signals to the source signal lines.

According to a ninth aspect of the present invention, in any one of the first to eighth aspects of the invention, the electro-optical device is characterized in that the memory circuits are static memories (SRAM).

According to a tenth aspect of the present invention, in any one of the first to eighth aspects of the invention, the electro-optical device is characterized in that the memory circuits are ferroelectric memories (FeRAM).

According to an eleventh aspect of the present invention, in any one of the first to eighth aspects of the invention, the electro-optical device is characterized in that the memory circuits are dynamic memories (DRAM).

According to a twelfth aspect of the present invention, in any one of the first to eleventh aspects of the invention, the electro-optical device is characterized in that the memory circuits are formed on a glass substrate.

According to a thirteenth aspect of the present invention, in any one of the first to eleventh aspects of the invention, the electro-optical device is characterized in that the memory circuits are formed on a plastic substrate.

According to a fourteenth aspect of the present invention, in any one of the first to eleventh aspects of the invention, the electro-optical device is characterized in that the memory circuits are formed on a stainless substrate.

According to a fifteenth aspect of the present invention, in any one of the first to eleventh aspects of the invention, the electro-optical device is characterized in that the memory circuits are formed on a single crystal wafer.

According to a sixteenth aspect of the present invention, a driving method of an electro-optical device for carrying out a display of an image using n-bit (n is a natural number, 2≤n) digital image signals is characterized in that:

the electro-optical device includes a source signal line driver circuit, a gate signal line driver circuit, and a plurality of pixels;

in the source signal line driver circuit, sampling pulses are outputted from shift registers and are inputted to latch circuits;

in the latch circuits, the digital image signals are held in accordance with the sampling pulses;

the held digital image signals are transferred into a source signal line;

in the gate signal line driver circuit, a gate signal line selection pulse is outputted and a gate signal line is selected; and in each of the plurality of pixels, writing of the n-bit digital image signals inputted from the source signal line into memory circuits, and reading of the n-bit digital image signals stored in the memory circuits are carried out at a row where the gate signal line is selected.

According to a seventeenth aspect of the present invention, a driving method of an electro-optical device for carrying out a display of an image using n-bit (n is a natural number, 2≤n) digital image signals is characterized in that:

the electro-optical device includes a source signal line driver circuit, a gate signal line driver circuit, and a plurality of pixels;

in the source signal line driver circuit, sampling pulses are outputted from shift registers and are inputted to latch circuits;

in the latch circuits, the digital image signals are held in accordance with the sampling pulses;

the held digital image signals are transferred into a source signal line;

the gate signal line driver circuit outputs a gate signal line selection pulse and sequentially selects gate signal lines from a first row, and in each of the plurality of pixels, writing of the n-bit digital image signals is sequentially carried out from the first row.

According to an eighteenth aspect of the present invention, a driving method of an electro-optical device for carrying out a display of an image using n-bit (n is a natural number, 2≤n) digital image signals is characterized in that:

the electro-optical device includes a source signal line driver circuit, a gate signal line driver circuit, and a plurality of pixels;

in the source signal line driver circuit, sampling pulses are outputted from shift registers and are inputted to latch circuits, in the latch circuits, the digital image signals are held in accordance with the sampling pulses;

the held digital image signals are transferred into a source signal line;

the gate signal line driver circuit outputs a gate signal line selection pulse to specify an arbitrary row of the gate signal lines and selects it, and in each of the plurality of pixels, writing of the n-bit digital image signals is carried out at the arbitrary row where the gate signal line is selected.

According to a nineteenth aspect of the present invention, in any one of the sixteenth to eighteenth aspects of the invention, the driving method is characterized in that, in a display period of a still picture, the n-bit digital image signals stored in the memory circuits are repeatedly read out to carry out a display of the still picture, and the source signal line driver circuit is stopped.

Further, it should be noted that the electro-luminescence (EL) display panel (device) referred to in this specification is also called a light-emitting device or a light-emitting diode.

DETAILED DESCRIPTION OF THE PREFERRED EMBODIMENTS

Figure 2:
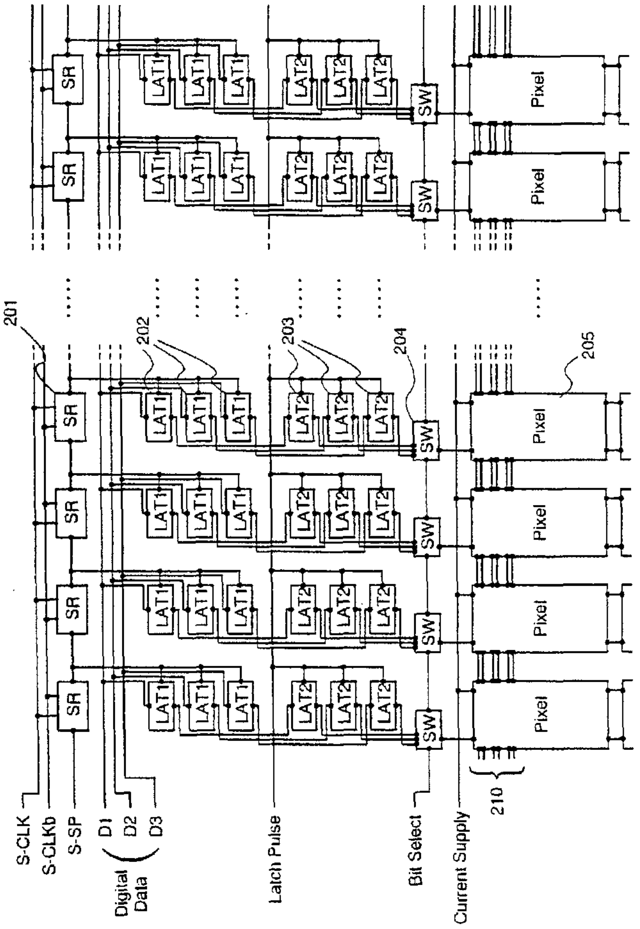
FIG. 2 is a view showing a circuit structural example of a source signal line driver circuit for carrying out a display by using the pixel of the present invention.

A mode for carrying out the invention will be described below. FIG. 2 shows a structure of a source signal line driver circuit and some pixels in an electro-optical device using a pixel including a plurality of memory circuits. This circuit corresponds to a 3-bit digital gradation signal, and includes shift register circuits 201, first latch circuits 202, second latch circuit 203, bit signal selection switches 204, and pixels 205. Reference numeral 210 designates a signal supplied from a gate signal line driver circuit or directly from the outside, and is described later together with the description of the pixel.

Figure 1:
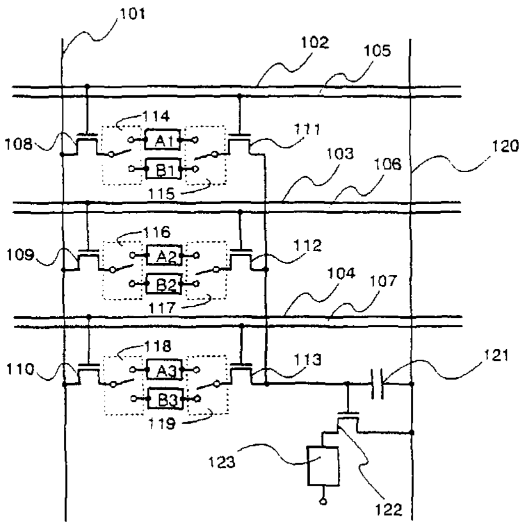
FIG. 1 is a circuit diagram of a pixel of the present invention, which includes a plurality of memory circuits in its inside.

FIG. 1 shows a circuit structure of the pixel 205 in FIG. 2 in detail. This pixel corresponds to 3-bit digital gradation, and includes an EL element (EL) 123, a storage capacitor (Cs) 121, memory circuits (A1 to A3 and B1 to B3), and so on. Reference numeral 101 designates a source signal line; 102 to 104 designate writing gate signal lines; 105 to 107 designate reading gate signal lines; 108 to 110 designate writing TFTs; 111 to 113 designate reading TFTs; 114 designates a first writing memory circuit selection portion; 115 designates a first reading memory circuit selection portion; 116 designates a second writing memory circuit selection portion; 117 designates a second reading memory circuit selection portion; 118 designates a third writing memory circuit selection portion; 119 designates a third reading memory circuit selection portion; 120 designates a current supply line; and 122 designates an EL driving TFT.

Each of the memory circuits (A1 to A3 and B1 to B3) included in the pixel shown in FIG. 1 can store a 1-bit digital image signal, and here, the memory circuits A1 to A3 are made one set, the memory circuits B1 to B3 are made one set, and each set stores a 3-bit digital image signal. That is, the pixel shown in FIG. 1 can store 3-bit digital image signals for two frames.

FIG. 3 is a timing chart in the display device of the present invention shown in FIG. 1. The display device is for the 3-bit digital gradation and VGA. A driving method will be described with reference to FIGS. 1 to 3. Further, the reference numerals in FIGS. 1 to 3 are used as they are (drawing number is omitted).

Figures 3A, 3B, 3C:
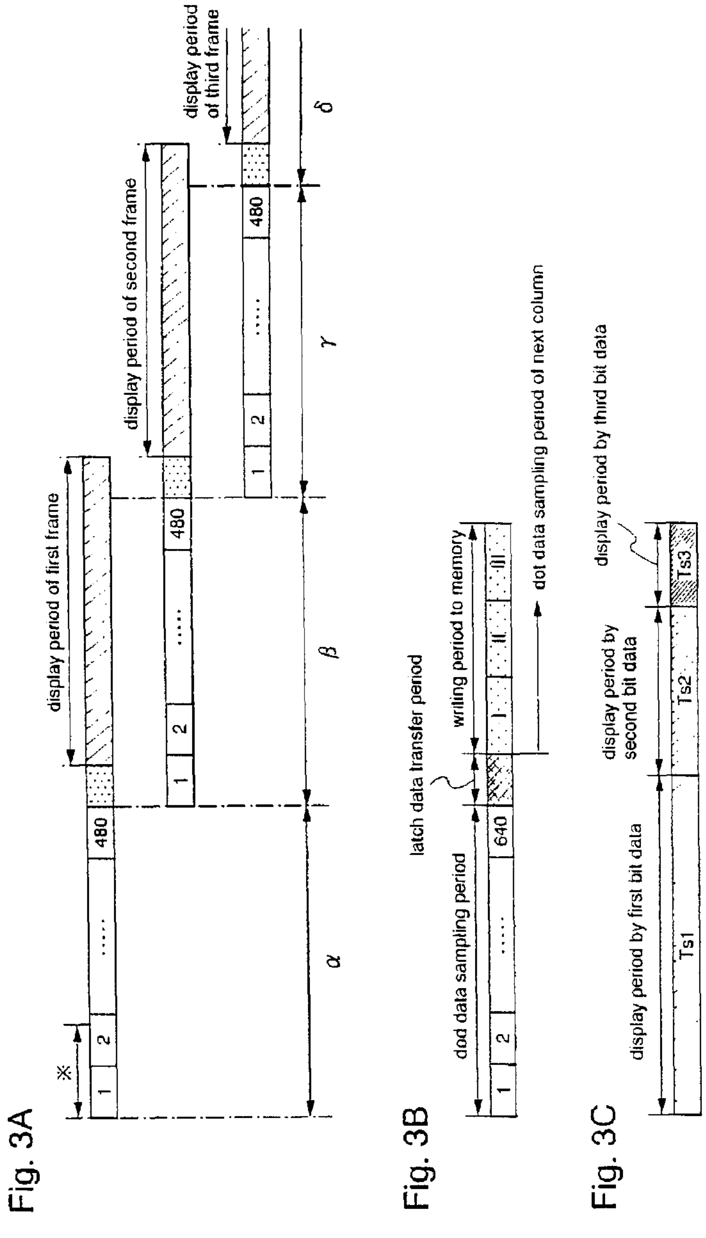
FIGS. 3A to 3C are views showing timing charts for carrying out a display by using the pixel of the present invention.

Reference will be made to FIG. 2 and FIGS. 3A and 3B. In FIG. 3A, respective frame periods are denoted by α, β, γ, and δ, and the description will be given. First, the circuit operation in the frame period α will be described.

Similarly to the case of the conventional digital system driver circuit, clock signals (S-CLK, S-CLKb) and a start pulse (S-SP) are inputted to the shift register circuits 201, and sampling pulses are sequentially outputted. Subsequently, the sampling pulses are inputted to the first latch circuits 202 (LAT 1), which respectively hold digital image signals (Digital Data) inputted to the same first latch circuits 202. This period is expressed as a dot data sampling period in this specification. The dot data sampling period for one horizontal period is each period indicated by 1 to 480 in FIG. 3A. The digital image signal has 3 bits, D1 is the MSB (Most Significant Bit), and D3 is the LSB (Least Significant Bit). In the first latch circuits 202, when holding of the digital image signals for one horizontal period is completed, in a retrace period, the digital image signals held in the first latch circuits 202 are transferred to the second latch circuits 203 (LAT 2) all at once in accordance with the input of a latch signal (Latch Pulse).

Subsequently, in accordance with sampling pulses outputted from the shift registers 201, the holding operation of digital image signals for a next horizontal period is again carried out.

On the other hand, the digital image signals transferred to the second latch circuits 203 are written into the memory circuits arranged in the pixels. As shown in FIG. 3B, a next line dot data sampling period is divided into I, II and III, and the digital image signals held in the second latch circuits are outputted to the source signal lines. At this time, they are selectively connected by the bit signal selection switch 204 so that the signal of each bit is successively outputted to the source signal line.

In the period I, a pulse is inputted to the writing gate signal line 102, the writing TFT 108 is turned on, the memory circuit selection portion 114 selects the memory circuit A1, and the digital image signal is written into the memory circuit A1. Subsequently, in the period II, a pulse is inputted to the writing gate signal line 103, the writing TFT 109 is turned on, the memory circuit selection portion 116 selects the memory circuit A2, and the digital image signal is written into the memory circuit A2. Finally, in the period III, a pulse is inputted to the writing gate signal line 104, the writing TFT 110 is turned on, the memory circuit selection portion 118 selects the memory circuit A3, and the digital image signal is written into the memory circuit A3.

Here, the processing of the digital image signals for one horizontal period is completed. The period of FIG. 3B is a period indicated by the mark * in FIG. 3A. The above operation is carried out to the final stage, so that the digital image signals for one frame are written in the memory circuits A.

In the electro-optical device of the present invention, the 3-bit digital gradation is expressed by a time gradation system. The time gradation system is different from a normal system in which the brightness is controlled by a voltage applied to a pixel, and is such a system that only two kinds of voltages are applied to a pixel, two states of ON and OFF are used, and the gradation is obtained by using a difference in lighting time. In the time gradation system, when n-bit gradation expression is given, the display period is divided into n periods, the ratio of lengths of the respective periods is made the powers of 2, such as $2^{n-1}:2^{n-2}, \ldots 2^0$, and a difference in the length of lighting time is produced according to which period has the pixel of the ON state, whereby the gradation is expressed.

Besides, even if the length of a display period is divided at a ratio other than the powers of 2 and a gradation display is carried out, the display is enabled.

On the basis of the above, the operation in the frame period â will be described. When writing into the memory circuits at the final stage is ended, a display of the first frame is carried out. FIG. 3C is a view for explaining the 3-bit time gradation system. Now, the digital image signals are stored for each bit in the memory circuits A1 to A3. Reference character Ts1 designates a display period by first bit data; Ts2 designates a display period by second bit data; and Ts3 designates a display period by third bit data. The lengths of the respective display periods are Ts1:Ts2:Ts3=4:2:1.

Here, since three bits are used, eight stages of 0 to 7 can be obtained for the brightness. In the case where a display is not carried out in any periods of Ts1 to Ts3, the brightness is 0, and when a display is carried out using all the periods. the brightness is 7. For example, in the case where the brightness 5 is desired to be displayed, a display has only to be carried out in a state where the pixel is turned ON in the display periods Ts1 and Ts3.

The description will be specifically given with reference to the drawings. In the display period Ts1, a pulse is inputted to the reading gate signal line 105, the reading TFT 111 is turned on, the memory circuit selection portion 115 selects the memory circuit A1, and the EL element is made to light up in accordance with the digital image signal stored in the memory circuit A1. Subsequently, in the display period Ts2, a pulse is inputted to the reading gate signal line 106, the reading TFT 112 is turned on, the memory circuit selection portion 117 selects the memory circuit A2, and the EL element is made to light up in accordance with the digital image signal stored in the memory circuit A2. Finally, in the display period Ts3, a pulse is inputted to the reading gate signal line 107, the reading TFT 113 is turned on, the memory circuit selection portion 119 selects the memory circuit A3, and the EL element is made to light up by the digital image signal stored in the memory circuit A3.

In the manner as described above, a display for one frame period is carried out. On the other hand, at the side of the driver circuit, the processing of digital image signals of a next frame period is carried out at the same time. The procedure is the same as the above up to the transfer of the digital image signals to the second latch circuits. In a subsequent writing period into memory circuits, the memory circuits different from the memory circuits storing the digital image signals in the former frame period are used.

In the period I, a pulse is inputted to the writing gate signal line 102, the writing TFT 108 is turned on, the memory circuit selection portion 114 selects the memory circuit B1, and the digital image signal is written into the memory circuit B1. Subsequently, in the period II, a pulse is inputted to the writing gate signal line 103, the writing TFT 109 is turned on, the memory circuit selection portion 116 selects the memory circuit B2, and the digital image signal is written into the memory circuit B2. Finally, in the period III, a pulse is inputted to the writing gate signal line 104, the writing TFT 110 is turned on, the memory circuit selection portion 118 selects the memory circuit B3, and the digital image signal is written into the memory circuit B3.

Subsequently, in the frame period γ, a display of the second frame is carried out in accordance with the digital image signals stored in the memory circuits B1 to B3. At the same time, the processing of digital image signals of a next frame period is started. The digital image signals are again stored in the memory circuits A1 to A3 in which the display of the first frame is completed.

Thereafter, a display of the digital image signals stored in the memory circuits A1 to A3 is carried out in the frame period δ, and at the same time, the processing of digital image signals of a next frame period is started. The digital image signals are again stored in the memory circuits B1 to B3 in which the display of the second frame is completed.

The above operation is repeated, and a display of an image is continuously carried out. Here, in the case where a still picture is displayed, after the digital image signals are once stored in the memory circuits A1 to A3 by the first operation, the digital image signals stored in the memory circuits A1 to A3 have only to be read out repeatedly in the respective frame periods. Accordingly, in the periods in which the still picture is displayed, the driving of the source signal line driver circuit can be stopped.

It should be noted that decoder circuits may be used as the source signal line driver circuit and/or gate signal line driver circuit. By this way, an arbitrary row or column can be selected, so that a digital image signal can be written to art arbitrary pixel.

Further, writing of the digital image signals into the memory circuits or reading of the digital image signals from the memory circuits can be carried out in the unit of one gate signal line. That is, it is also possible to take such a display method that the source signal line driver circuit is made to operate only for a short time, and only a part of a screen is rewritten.

Besides, in the mode for carrying out the invention, although one pixel includes the memory circuits A1 to A3 and B1 to B3, and has the function to store the 3-bit digital image signals for two frames, the present invention is not limited to this number. That is, in order to store n-bit digital image signals for m frames, one pixel has only to include n×m memory circuits.

By the above method, the digital image signals are stored by using the memory circuits installed in the pixel, and when a still picture is displayed, the digital image signals stored in the memory circuits are repeatedly used in the respective frame periods, and the still picture can be continuously displayed without driving the source signal line driver circuit. Thus, the invention can greatly contribute to reduction in electric power consumption of the electro-optical device.

Besides, with respect to the source signal line driver circuit, from the problem of the arrangement of latch circuits and the like which are increased in accordance with the number of bits, it is not always necessary to integrally form the circuit on the insulator, but a part thereof or all may be constructed externally.

Further, in the source signal line driver circuit of the electro-optical device described in the mode for carrying out the invention, although the latch circuits corresponding to the number of bits are arranged, it is also possible to arrange the latch circuit for only one bit and to make it operate. In this case, digital image signals from the upper bit to the lower bit have only to be inputted to the latch circuit in series.

Hereinafter, embodiments of the present invention will be described.

EMBODIMENT 1

In this embodiment, the memory circuit selection portion in the circuit described in the mode for carrying out the invention is specifically constructed by using transistors and the like, and the operation will be described.

Figure 4A:
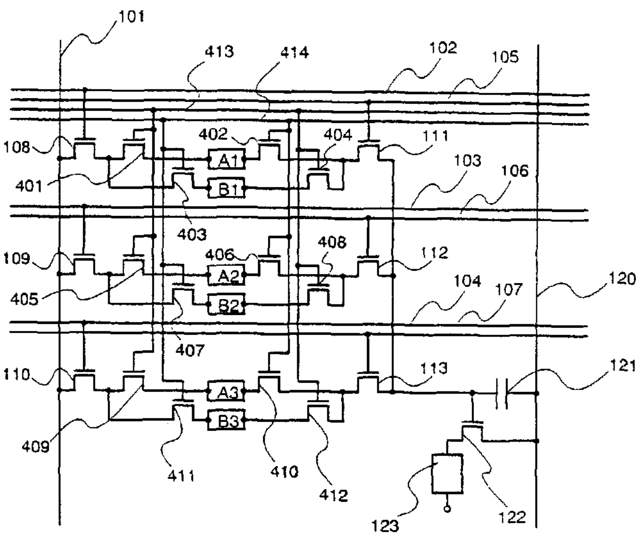
FIGS. 4A and 4B are detailed circuit diagrams of a pixel of the present invention, which includes a plurality of memory circuits in its inside.

FIG. 4A shows an example similar to the pixel shown in FIG. 1 and the memory circuit selection portions 114 to 119 are actually constructed by circuits. In the drawings, with respect to the numbers given to the respective portions, the same portions as those of FIG. 1 are given the same numbers as those of FIG. 1. Writing selection TFTs 401, 403, 405, 407, 409 and 411, and reading selection TFTs 402, 404, 406, 408, 410 and 412 are provided in memory circuits A1 to A3 and B1 to B3, and are controlled by memory circuit selection signal lines 413 and 414.

Figure 4B:
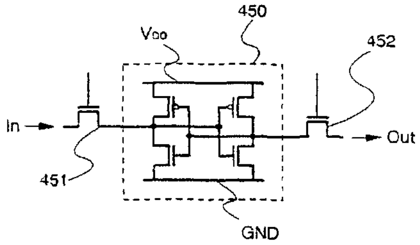

FIG. 4B shows an example of the memory circuit. A portion indicated by a dotted line frame 450 is a memory circuit (portion indicated by A1 to A1 and B1 to B3 in FIG. 4A). Reference numeral 451 designates a writing selection TFT; and 452 designates a reading selection TFT. In the memory circuit shown here, although a static memory (Static RAM: SRAM) made of two inverters connected into a loop is used, the memory circuit is not limited to this structure. Here, in the case where the SRAM is used for the memory circuit, the pixel may be made to have a structure which does not include a storage capacitor (Cs) 121.

In this embodiment, driving of the circuit shown in FIG. 4A can be made in accordance with the timing charts shown in FIGS. 3A to 3C in the mode for carrying out the invention. The circuit operation, together with an actual driving method of the memory circuit selection portion, will be described with reference to FIGS. 3A to 3C and FIG. 4A. Further, the respective numbers in FIGS. 3A to 3C and FIG. 4A are used as they are (drawing number is omitted).

Reference will be made to FIGS. 3A and 3B. In FIG. 3A, respective frame periods are denoted by α, β, γ, and δ, and the explanation will be given. First, the circuit operation in the frame period α will be described.

Since a driving method from the shift registers to the second latch circuits is the same as that shown in the mode for carrying out the invention, the method obeys that.

First, a pulse is inputted to the memory circuit selection signal line 413, the writing selection TFTs 401, 405 and 409 are turned on, and a state is obtained in which writing into the memory circuits A1 to A3 is enabled. In the period I, a pulse is inputted to the writing gate signal line 102, the TFT 108 is turned on, and the digital image signal is written into the memory circuit A1. Subsequently, in the period II, a pulse is inputted to the writing gate signal line 103, the writing TFT 109 is turned on, and the digital image signal is written into the memory circuit A2. Finally, in the period III, a pulse is inputted to the writing gate signal line 104, the writing TFT 110 is turned on, and the digital image signal is written into the memory circuit A3.

Here, the processing of the digital image signals for one horizontal period is completed. The period of FIG. 3B is a period indicated by the mark * in FIG. 3A. The above operation is carried out to the final stage, so that the digital image signals for one frame are written in the memory circuits A1 to A3.

Subsequently, the operation in the frame period β will be described. When writing into the memory circuits at the final stage is ended, a display of the first frame is carried out. FIG. 3C is a view for explaining the 3-bit time gradation system. Now, the digital image signals for respective bits are stored in the memory circuits A1 to A3. Reference character Ts1 designates a display period by first bit data; Ts2 designates a display period by second bit data; and Ts3 designates a display period by third bit data. The lengths of the respective display periods are Ts1:Ts2:Ts3=4:2:1.

However, even if the length of the display period is divided into periods other than the powers of 2 to carry out a gradation display, a display is enabled.

Here, since three bits are used, eight stages of 0 to 7 can be obtained for the brightness. In the case where a display is not carried out in any periods of Ts1 to Ts3, the brightness is 0, and when a display is carried out using all periods, the brightness is 7. For example, in the case where the brightness 5 is desired to be displayed, a display has only to be carried out in such a state that the pixel is made to have the ON state in the display periods Ts1 and Ts3.

The description will be specifically given with reference to the drawings. After the writing operation to the memory circuits is ended, when it proceeds to a display period, the pulse which has been inputted to the memory circuit selection signal line 413 is ended, and at the same time, a pulse is inputted to the memory circuit selection signal line 414, the writing TFTs 401, 405, and 409 are turned off, the reading TFTs 402, 406 and 410 are turned on, and there occurs such a state that reading from the memory circuits A1 to A3 is enabled. In the display period Ts1, a pulse is inputted to the reading gate signal line 105, the reading TFT 111 is turned on, and the EL element 123 lights up in accordance with the digital image signal stored in the memory circuit A1. Subsequently, in the display period Ts2, a pulse is inputted to the reading gate signal line 106, the reading TFT 112 is turned on, and the EL element 123 lights up in accordance with the digital image signal stored in the memory circuit A2. Finally, in the display period Ts3, a pulse is inputted to the reading gate signal line 107, the reading TFT 113 is turned on, and the EL element 123 lights up in accordance with the digital image signal stored in the memory circuit A3.

In the manner as described above, a display for one frame period is carried out. On the other hand, at the side of the driver circuit, the processing of digital image signals of a next frame period is carried out at the same time. The procedure up to the transfer of the digital image signals to the second latch circuits is the same as the above. In a subsequent writing period into memory circuits, the memory circuits B1 to B3 are used.

Note that, in the periods in which the signals are written into the memory circuits A1 to A3, although the writing TFTs 401, 405, and 409 to the memory circuits A1 to A3 are turned on, at the same time, the reading TFTs 404, 408 and 412 from the memory circuits B1 to B3 are also turned on. Similarly, when the reading TFTs 402, 406, and 410 from the memory circuits A1 to A3 are turned on, at the same time, the writing TFTs 403, 407 and 411 to the memory circuits B1 to B3 are also turned on, and in the mutual memory circuits, writing and reading are alternately carried out in a certain frame period.

In the period I, a pulse is inputted to the writing gate signal line 102, the writing TFT 108 is turned on, and the digital image signal is written into the memory circuit B1. Subsequently, in the period II, a pulse is inputted to the writing gate signal line 103, the writing TFT 109 is turned on, and the digital image signal is written into the memory circuit B2. Finally, in the period III, a pulse is inputted to the writing gate signal line 104, the writing TFT 110 is turned on, and the digital image signal is written into the memory circuit B3.

Subsequently, in the frame period γ, a display of the second frame is carried out in accordance with the digital image signals stored in the memory circuits B1 to B3. At the same time, the processing of digital image signals of a next frame period is started. The digital image signals are again stored in the memory circuits A1 to A3 in which the display of the first frame is completed.

Thereafter, a display of the digital image signals stored in the memory circuits A1 to A3 is carried out in the frame period δ, and at the same time, the processing of digital image signals of a next frame period is started. The digital image signals are again stored in the memory circuits B1 to B3 in which the display of the second frame is completed.

The above procedure is repeated, and a display of an image is carried out. Incidentally, in the case where a still picture is displayed, after writing of the digital image signals of a certain frame into the memory circuits is completed, the source signal line driver circuit is stopped, the signals stored in the same memory circuits are read out for each frame, and a display is carried out. By the method like this, electric power consumption during the display of the still picture can be greatly reduced.

EMBODIMENT 2

In this embodiment, a description will be given of an example in which writing into memory circuits of a pixel portion is carried out in dot sequence, so that second latch circuits of a source signal line driver circuit are omitted.

Figure 5:
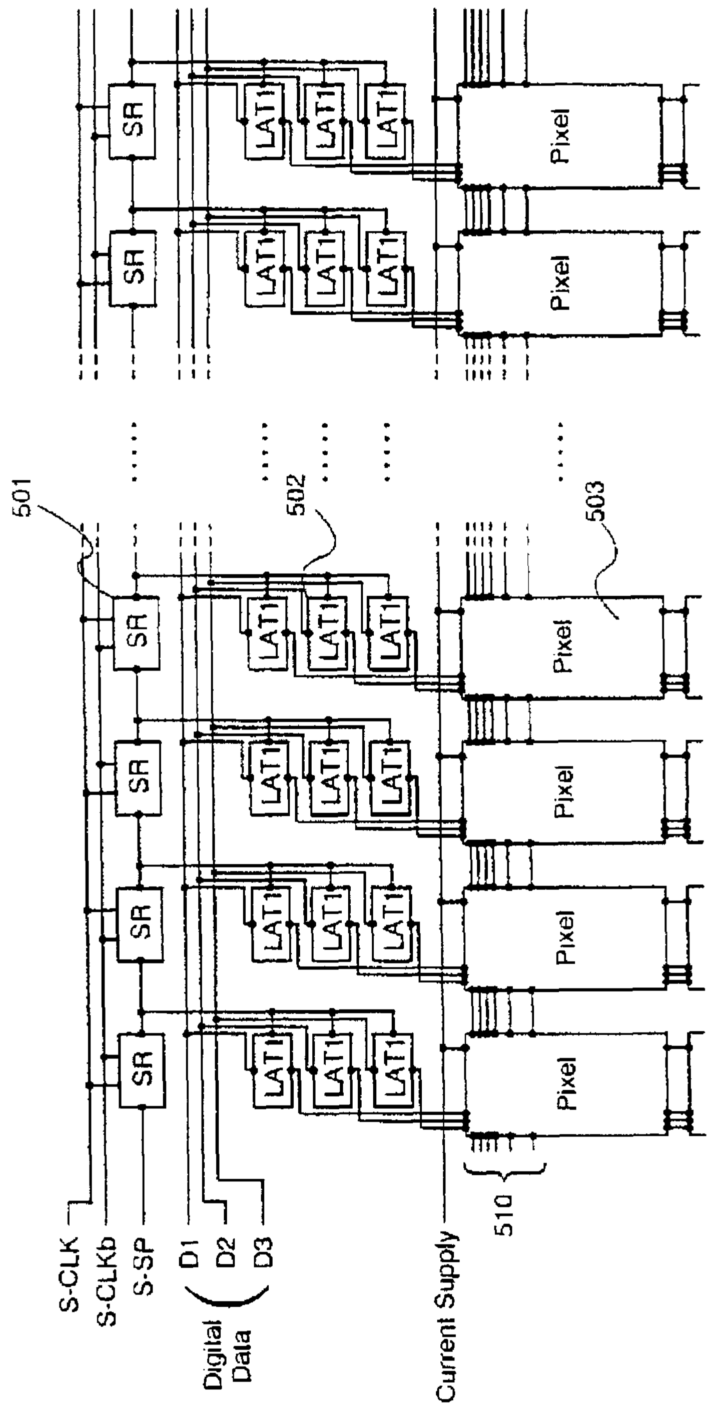
FIG. 5 is a view showing a circuit structural example of a source signal line driver circuit which does not have a second latch circuit.

FIG. 5 shows a structure of a source signal line driver circuit and some pixels in an electro-optical device using a pixel including memory circuits. This circuit corresponds to a 3-bit digital gradation signal, and includes shift register circuits 501, latch circuits 502, and pixels 503. Reference numeral 510 designates a signal supplied from a gate signal line driver circuit or directly from the outside, and is described later together with the description of the pixel.

Figure 21:
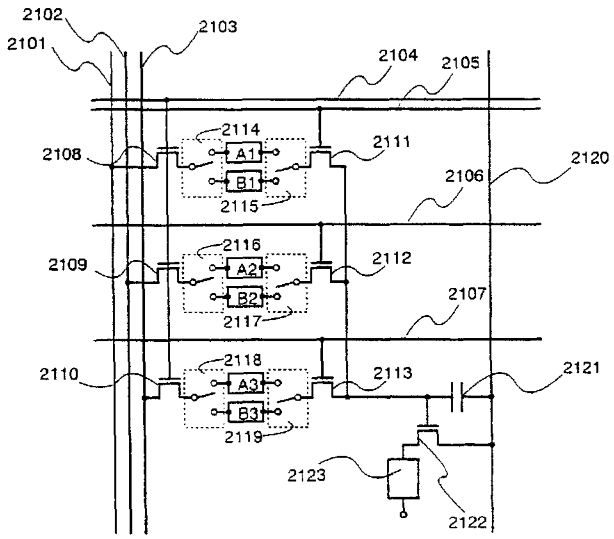
FIG. 21 is a circuit diagram of a pixel driven by the source signal line driver circuit of FIG. 5.

FIG. 21 is a detailed view of a circuit structure of the pixel 503 shown in FIG. 5. Similarly to the embodiment 1, this pixel corresponds to 3-bit digital gradation, and includes a plurality of memory circuits (A1 to A3 and B1 to B3) and includes EL element (EL) 2123, a storage capacitor (Cs) 2121, and so on. Reference numerals 2101 to 2103 designate source signal lines; 2104 designates a writing gate signal line; 2105 to 2107 designate reading gate signal lines; 2108 to 2110 designate writing TFTs; 2111 to 2113 designate reading TFTs; 2114 designates a first writing memory circuit selection portion; 2115 designates a first reading memory circuit selection portion; 2116 designates a second writing memory circuit selection portion; 2117 designates a second reading memory circuit selection portion; 2118 designates a third writing memory circuit selection portion; 2119 designates a third reading memory circuit selection portion; 2120 designates a current supply line; and 2122 designates an EL driving TFT.

Figure 6:
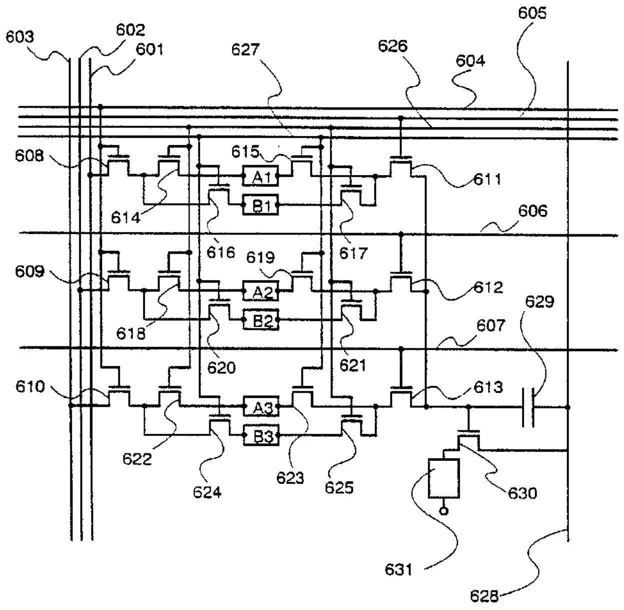
FIG. 6 is a detail circuit diagram of a pixel to which the present invention is applied, which is driven by the source signal line driver circuit of FIG. 5.

FIG. 6 shows a structure in which writing memory circuit selection portions 2114, 2116, and 2118 and reading memory circuit selection portions 2115, 2117, and 2119 are constructed similarly to the embodiment 1. Reference numeral 601 designates a source signal line for a first bit (MSB) signal; 602 designates a source signal line for a second bit signal; 603 designates a source signal line for a third bit (LSB) signal; 604 designates a writing gate signal line; 605 to 607 designate reading gate signal lines; 608 to 610 designate writing TFTs; and 611 to 613 designate reading TFTs. The memory circuit selection portion is constructed by using writing selection TFTs 614, 616, 618, 620, 622, and 624 and reading selection TFTs 615, 617, 619, 621, 623, and 625, and the like. Reference numerals 626 and 627 designate memory circuit selection signal lines. A current supply line 628, a storage capacitor (Cs) 629, an EL driving TFT 630, and an EL element 631 may be the same as those of the embodiment 1.

Figures 7A, 7B, 7C:
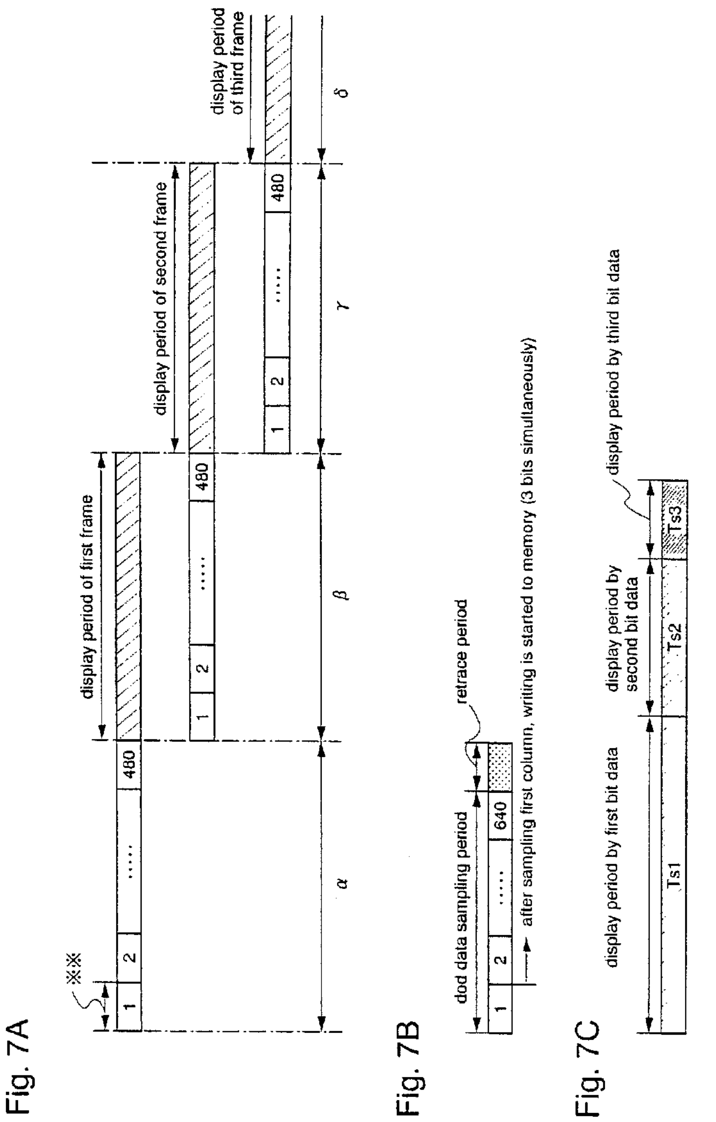
FIGS. 7A to 7C are views showing timing charts for carrying out a display by using the circuits shown in FIGS. 5 and 6.

FIGS. 7A to 7C are timing charts with respect to the driving of the circuit shown in this embodiment. The description will be given with reference to FIG. 6 and FIGS. 7A to 7C.

The operation from the shift register circuits 501 to the latch circuits (LAT 1) 502 is carried out similarly to the mode for carrying out the invention and the embodiment 1. As shown in FIG. 7B, when the latch operation at the first stage is ended, writing into the memory circuits of the pixel is immediately started. A pulse is inputted to the writing gate signal line 604, the writing TFTs 608 to 610 are turned on, and further, a pulse is inputted to the memory circuit selection signal line 626, the writing selection TFTs 614, 618, and 622 are turned on, and there occurs such a state that writing into the memory circuits A1 to A3 is enabled. The digital image signals for the respective bits held in the latch circuits 502 are simultaneously written through the three source signal lines 601 to 603.

When the digital image signals held in the latch circuits is being stored into the memory circuits at the first stage, at the next stage, the digital image signals are held in the latch circuits in accordance with sampling pulses. In this way, writing into the memory circuits is sequentially carried out.

The above is carried out in one horizontal period (period indicated by  in FIG. 7A), and is repeated a predetermined number of times, the number being equal to the number of the gate signal lines, and when writing of the digital image signals for one frame in the frame period α into the memory circuits is ended, the procedure proceeds to the display period of the first frame indicated by the frame period â The pulse which has been inputted to the writing gate signal line 604 is stopped, and further, the pulse which has been inputted to the memory circuit selection signal line 626 is stopped, and instead thereof, a pulse is inputted to the memory circuit selection signal line 627, the readout selecting TFTs 615, 619, and 623 are turned on, and there occurs such a state that reading from the memory circuits A1 to A3** is enabled.

Subsequently, by the time gradation system described in the mode for carrying out the invention, the embodiment 1 and so on, as shown in FIG. 7C, in the display period Ts1, a pulse is inputted to the reading gate signal line 605, the reading TFT 611 is turned on, and a display is carried out by the digital image signal written in the memory circuit A1. Subsequently, in the display period Ts2, a pulse is inputted to the reading gate signal line 606, the reading TFT 612 is turned on, and a display is carried out by the digital image signal written in the memory circuit A2. Similarly, in the display period Ts3, a pulse is inputted to the reading gate signal line 607, the reading TFT 613 is turned on, and a display is carried out by the digital image signal written in the memory circuit A3.

Here, the display period of the first frame is completed. In the frame period β, the processing of digital image signals in a next frame is carried out at the same time. The procedure similar to the foregoing is carried out up to the holding of the digital image signals in the latch circuits 502. In a subsequent writing period into memory circuits, the memory circuits B1 to B3 are used.

Incidentally, in the period when signals are written into the memory circuits A1 to A3, although the writing TFTs 614, 618 and 622 to the memory circuits A1 to A3 are turned on, the reading TFTs 617, 621, and 625 from the memory circuits B1 to B3 are also turned on at the same time. Similarly, when the reading TFTs 615, 619 and 623 from the memory circuits A1 to A3 are turned on, the writing TFTs 616, 620 and 624 to the memory circuits B1 to B3 are also turned on at the same time, and writing and reading are alternately carried out in a certain frame period in the mutual memory circuits.

The writing operation and reading operation to the memory circuits B1 to B3 are the same as those of the memory circuits A1 to A3. When the writing into the memory circuits B1 to B3 is ended, the frame period γ starts, and the display period of a second frame starts. Further, in this frame period, the processing of digital image signals in a next frame is carried out. The procedure similar to the foregoing is carried out up to the holding of the digital image signals in the latch circuit 502. In the subsequent writing period into memory circuits, the memory circuits A1 to A3 are again used.

Thereafter, a display of the digital image signals stored in the memory circuits A1 to A3 is carried out in the frame period δ, and at the same time, the processing of digital image signals in a next frame period is started. The digital image signals are again stored in the memory circuits B1 to B3 in which the display of the second frame is completed.

The above procedure is repeated, so that an image is displayed. Incidentally, in the case where a display of a still picture is carried out, when writing of digital image signals of a certain frame into the memory circuits is completed, the source signal line driver circuit is stopped, the signals written in the same memory circuits are read out in each frame, and a display is carried out. By the method like this, electric power consumption during the display of the still picture can be greatly reduced. Further, when compared with the circuit described in the embodiment 1, the number of latch circuits can be made a half, which contributes to the miniaturization of the whole device by reduction in space of the circuit arrangement.

EMBODIMENT 3

In this embodiment, a description will be given of an example of an electro-optical device which uses the circuit structure of an electro-optical device in which the second latch circuits are omitted, as described in the embodiment 2, and uses a method of carrying out writing into memory circuits in a pixel by linear sequential driving.

Figure 17:
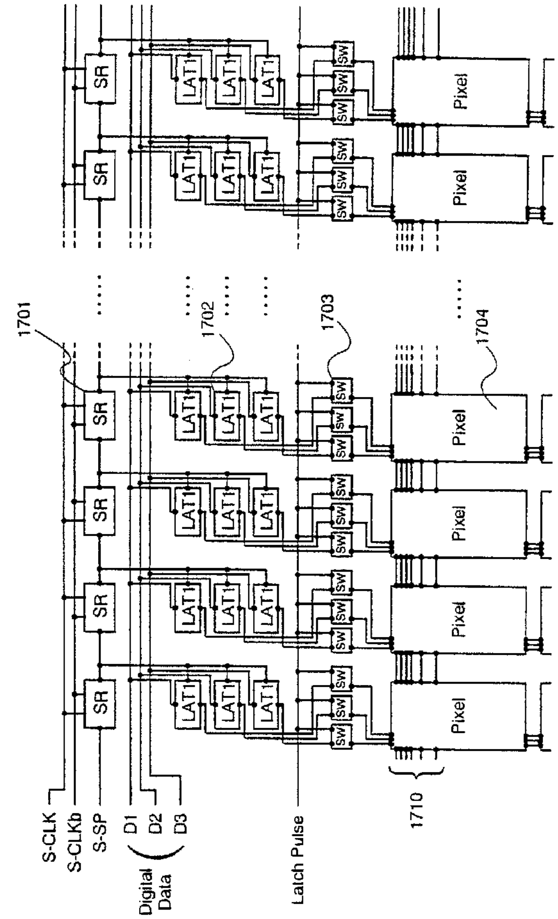
FIG. 17 is a view showing a circuit structural example of a source signal line driver circuit which does not have a second latch circuit.

FIG. 17 shows a circuit structural example of a source signal line driver circuit of an electro-optical device to be described in this embodiment. This circuit corresponds to a 3-bit digital gradation signal, and includes shift register circuits 1701, latch circuits 1702, switch circuits 1703, and pixels 1704. Reference numeral 1710 designates a signal supplied from a gate signal line driver circuit or directly from the outside. Since a circuit structure of a pixel may be the same as that of the embodiment 2, reference will be made to FIG. 6 as it is.

Figures 18A, 18B, 18C:
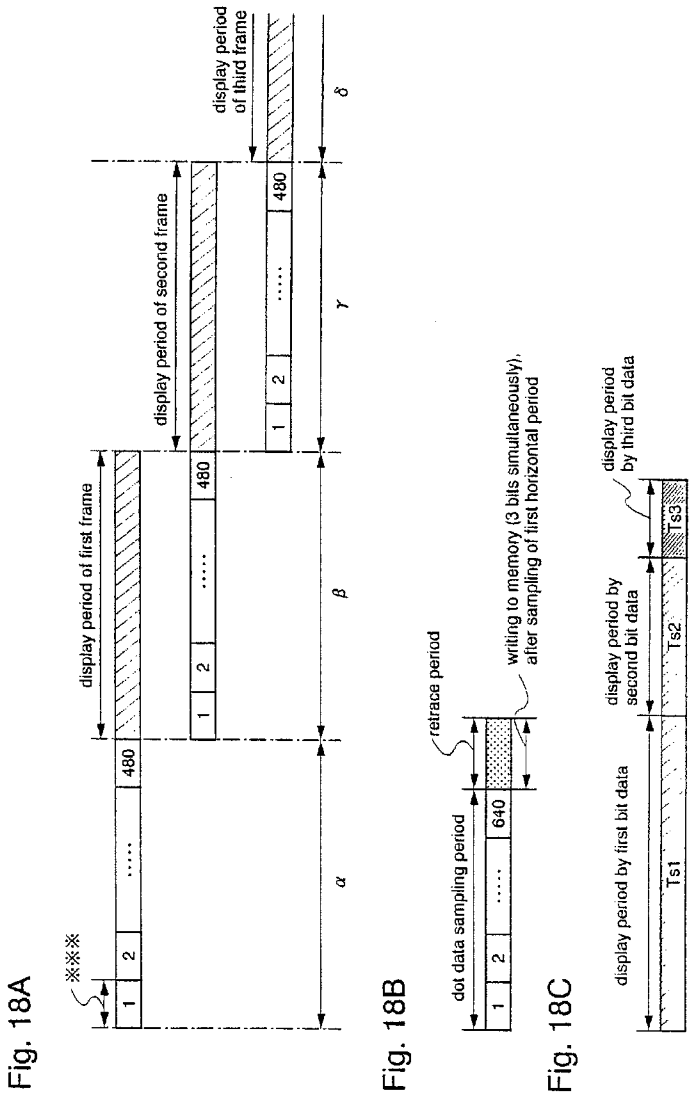
FIGS. 18A to 18C are views showing timing charts for carrying out a display by using the circuit shown in FIG. 17.
Figure 19A:
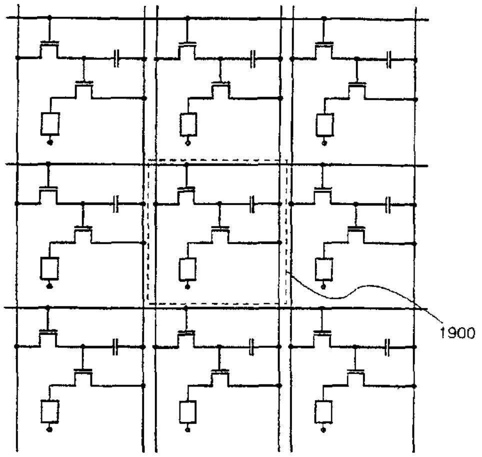
Fig. 19A Prior Art
FIGS. 19A and 19B are enlarged views of a pixel portion of a conventional electro-optical device.
Figure 19B:
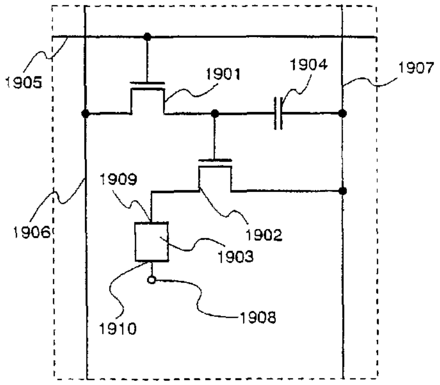
Fig. 19B Prior Art
Figures 20A, 20B, 20C, 20D:
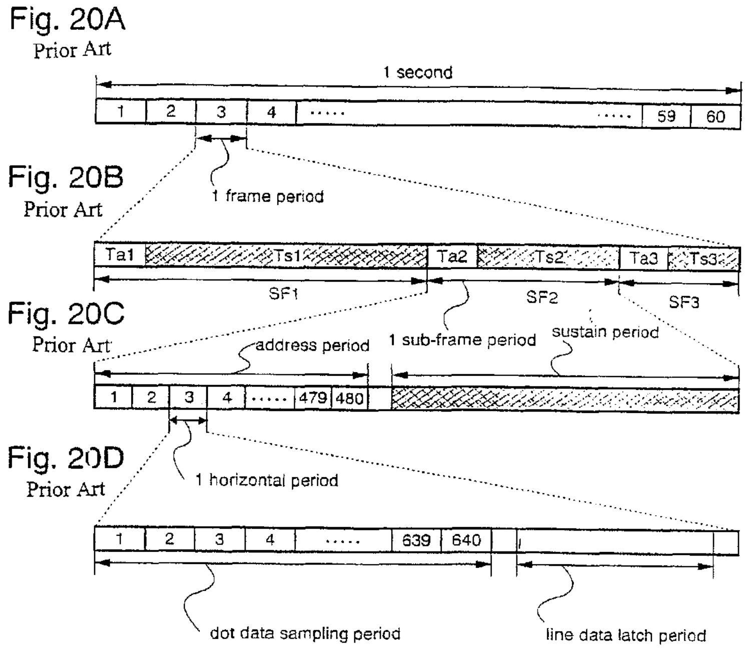
Fig. 20A Prior Art
Fig. 20B Prior Art
Fig. 20C Prior Art
Fig. 20D Prior Art
FIGS. 20A to 20D are views showing timings of a time gradation system in an electro-optical device.

FIGS. 18A to 18C are timing charts with respect to the driving of the circuit described in this embodiment. The description will be given with reference to FIG. 6, FIG. 17 and FIGS. 18A to 18C.

The operation in which sampling pulses are outputted from the shift register circuits 1701 and digital image signals are held in the latch circuits 1702 in accordance with the sampling pulses, is the same as in the embodiments 1 and 2. In this embodiment, since the switch circuits 1703 are provided between the latch circuits 1702 and the memory circuits in the pixels 1704, even if holding of the digital image signals in the latch circuits is completed, writing into the memory circuits is not immediately started. The switch circuits 1703 remain closed till a dot data sampling period is completed, and the latch circuits continue to hold the digital image signals.

As shown in FIG. 18B, when holding of the digital image signals for one horizontal period is completed, a latch signal (Latch Pulse) is inputted in a subsequent retrace period, the switch circuits 1703 are opened all at once, and the digital image signals held in the latch circuits 1702 are written into the memory circuits in the pixels 1704 all at once. Since the operation in the pixels 1704 with respect to the writing operation at this time, and the operation in the pixels 1704 with respect to the re-reading operation of a display in a next frame period may be the same as in the embodiment 2, the description is omitted here.

By the above method, even in the source signal line driver circuit in which the latch circuits are omitted, the linear sequential writing can be easily carried out.

EMBODIMENT 4

In Embodiment 4, a method of simultaneously manufacturing TFTs of a pixel portion of an electro optical display of the present invention and driver circuit portions provided in the periphery thereof (a source signal line driver circuit, a gate signal line driver circuit and a pixel selective signal line driver circuit). However, in order to simplify the explanation, a CMOS circuit, which is the basic circuit for the driver circuit, is shown in the figures.

Figures 10A, 10B, 10C:
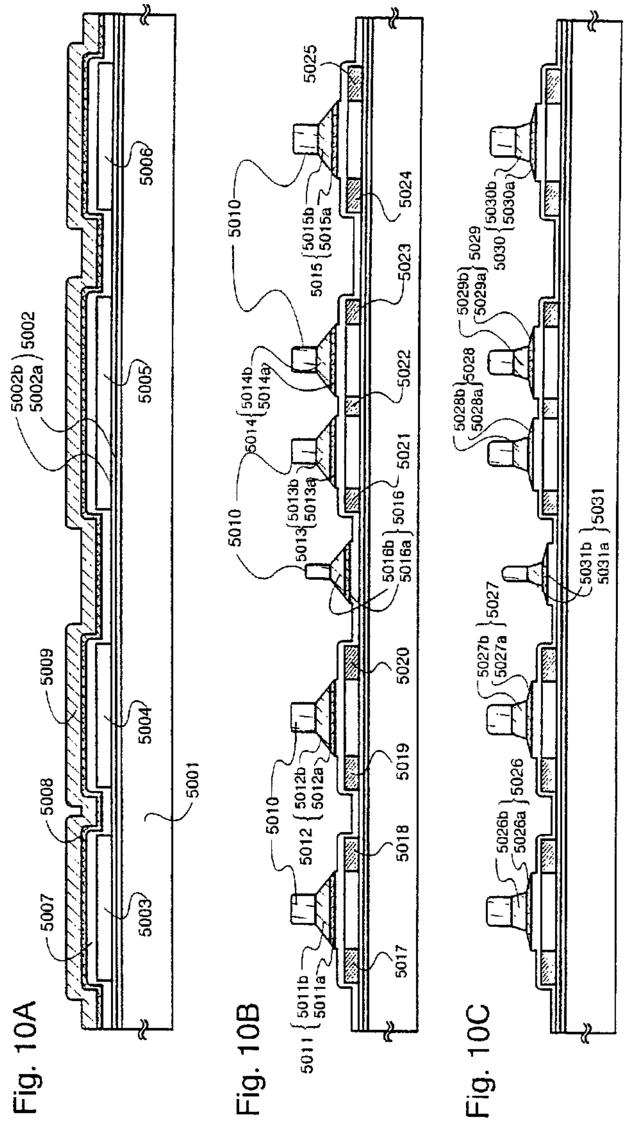
FIGS. 10A to 10C are views showing an example of a production process of an electro-optical device including a pixel of the present invention.

First, as shown in FIG. 10A, a base film 5002 made of an insulating film such as a silicon oxide film, a silicon nitride film, or a silicon oxynitride film is formed on a substrate 5001 made of glass such as barium borosilicate glass or alumino borosilicate glass, typified by #7059 glass or #1737 glass of Corning Inc. For example, a silicon oxynitride film 5002*a* fabricated from $SiH_4$, $NH_3$ and $N_2O$ by a plasma CVD method is formed with a thickness of 10 to 200 nm (preferably 50 to 100 nm), and a hydrogenated silicon oxynitride film 5002*b* similarly fabricated from $SiH_4$ and $N_2O$ is formed with a thickness of 50 to 200 nm (preferably 100 to 150 nm) to form a lamination. In Embodiment 4, although the base film 5002 is shown as the two-layer structure, the film may be formed of a single layer film of the foregoing insulating film or as a lamination structure of more than two layers.

Island-like semiconductor films 5003 to 5006 are formed of a crystalline semiconductor film manufactured by using a laser crystallization method on a semiconductor film having an amorphous structure, or by using a known thermal crystallization method. The thickness of the island-like semiconductor films 5003 to 5006 is set from 25 to 80 nm (preferably between 30 and 60 nm). There is no limitation on the crystalline semiconductor film material, but it is preferable to form the film from a silicon or a silicon germanium (SiGe) alloy.

A laser such as a pulse oscillation type or continuous emission type excimer laser, a YAG laser, or a $YVO_4$ laser is used for manufacturing the crystalline semiconductor film in the laser crystallization method. A method of condensing laser light emitted from a laser oscillator into a linear shape by an optical system and then irradiating the light to the semiconductor film may be employed when these types of lasers are used. The crystallization conditions may be suitably selected by the operator, but the pulse oscillation frequency is set to 30 Hz, and the laser energy density is set from 100 to 400 mJ/cm$^2$ (typically between 200 and 300 mJ/cm$^2$) when using the excimer laser. Further, the second harmonic is utilized when using the YAG laser, the pulse oscillation frequency is set from 1 to 10 kHz, and the laser energy density may be set from 300 to 600 mJ/cm$^2$ (typically between 350 and 500 mJ/cm$^2$). The laser light which has been condensed into a linear shape with a width of 100 to 1000 μm, for example 400 μm, is then irradiated over the entire surface of the substrate. This is performed with an overlap ratio of 80 to 98% in case of the linear laser.

Next, a gate insulating film 5007 is formed covering the island-like semiconductor layers 5003 to 5006. The gate insulating film 5007 is formed of an insulating film containing silicon with a thickness of 40 to 150 nm by a plasma CVD method or a sputtering method. A 120 nm thick silicon oxynitride film is formed in Embodiment 4. The gate insulating film 5007 is not limited to such a silicon oxynitride film, of course, and other insulating films containing silicon may also be used, in a single layer or in a lamination structure. For example, when using a silicon oxide film, it can be formed by the plasma CVD method with a mixture of TEOS (tetraethyl orthosilicate) and $O_2$, at a reaction pressure of 40 Pa, with the substrate temperature set from 300 to 400° C., and by discharging at a high frequency (13.56 MHz) with electric power density of 0.5 to 0.8 W/cm$^2$. Good characteristics of the silicon oxide film thus manufactured as a gate insulating film can be obtained by subsequently performing thermal annealing at 400 to 500° C.

A first conductive film 5008 and a second conductive film 5009 are then formed on the gate insulating film 5007 in order to form gate electrodes. In Embodiment 4, the first conductive film 5008 is formed from Ta with a thickness of 50 to 100 nm, and the second conductive film 5009 is formed from W with a thickness of 100 to 300 nm.

The Ta film is formed by sputtering, and sputtering of a Ta target is performed by using Ar. If an appropriate amount of Xe or Kr is added to the Ar during sputtering, the internal stress of the Ta film will be relaxed, and film peeling can be prevented. The resistivity of an α phase Ta film is on the order of 20 μΩcm, and the Ta film can be used for the gate electrode, but the resistivity of a β phase Ta film is on the order of 180 μΩcm and the Ta film is unsuitable for the gate electrode. The α phase Ta film can easily be obtained if a tantalum nitride film, which possesses a crystal structure near that of phase Ta, is formed with a thickness of 10 to 50 nm as a base for Ta in order to form the phase Ta film.

The W film is formed by sputtering with W as a target. The W film can also be formed by a thermal CVD method using tungsten hexafluoride ($WF_6$). Whichever is used, it is necessary to make the film low resistant in order to use it as the gate electrode, and it is preferable that the resistivity of the W film be set 20 μΩcm or less. The resistivity can be lowered by enlarging the crystals of the W film, but for cases where there are many impurity elements such as oxygen within the W film, crystallization is inhibited, and the film becomes high resistant. A W target having a purity of 99.9999% is thus used in sputtering. In addition, by forming the W film while taking sufficient care such that no impurities from the inside of the gas phase are introduced at the time of film formation, a resistivity of 9 to 20 μΩcm can be achieved.

Note that although the first conductive film 5008 and the second conductive film 5009 are formed from Ta and W, respectively, in Embodiment 4, the conductive films are not limited to these. Both the first conductive film 5008 and the second conductive film 5009 may also be formed from an element selected from the group consisting of Ta, W, Ti, Mo, Al, and Cu, or from an alloy material or a chemical compound material having one of these elements as its main constituent. Further, a semiconductor film, typically a polysilicon film, into which an impurity element such as phosphorus is doped, may also be used. Examples of preferable combinations other than that in Embodiment 4 include: the first conductive film 5008 formed from tantalum nitride (TaN) and the second conductive film 5009 formed from W; the first conductive film 5008 formed from tantalum nitride (TaN) and the second conductive film 5009 formed from Al; and the first conductive film 5008 formed from tantalum nitride (TaN) and the second conductive film 5009 formed from Cu.

Next, a mask 5010 is formed from resist, and a first etching process is performed in order to form electrodes and wirings. An ICP (inductively coupled plasma) etching method is used in Embodiment 4. A gas mixture of $CF_4$, and $Cl_2$ is used as an etching gas, and a plasma is generated by applying a 500 W RF electric power (13.56 MHz) to a coil shape electrode at 1 Pa. A 100 W RF electric power (13.56 MHz) is also applied to the substrate side (test piece stage), effectively applying a negative self-bias voltage. The W film and the Ta film are both etched on the same order when $CF_4$ and $Cl_2$ are mixed.

Edge portions of the first conductive layer and the second conductive layer are made into a tapered shape in accordance with the effect of the bias voltage applied to the substrate side with the above etching conditions by using a suitable resist mask shape. The angle of the tapered portions is from 15 to 45°. The etching time may be increased by approximately 10 to 20% in order to perform etching without any residue on the gate insulating film. The selectivity of a silicon oxynitride film with respect to a W film is from 2 to 4 (typically 3), and therefore approximately 20 to 50 nm of the exposed surface of the silicon oxynitride film is etched by this over-etching process. First shape conductive layers 5011 to 5016 (first conductive layers 5011*a* to 5016*a* and second conductive layers 5011*b* to 5016*b*) are thus formed of the first conductive layer and the second conductive layer by the first etching process. At this point, regions of the gate insulating film 5007 not covered by the first shape conductive layers 5011 to 5016 are made thinner by approximately 20 to 50 nm by etching. (FIG. 10A)

Then, a first doping process is performed to add an impurity element for imparting a n-type conductivity. Doping may be carried out by an ion doping method or an ion implanting method. The condition of the ion doping method is that a dosage is $1\times10^{13}$ to $5\times10^{14}$ atoms/cm$^2$, and an acceleration voltage is 60 to 100 keV. As the impurity element for imparting the n-type conductivity, an element belonging to group 15, typically phosphorus (P) or arsenic (As) is used, but phosphorus is used here. In this case, the conductive layers 5011 to 5015 become masks to the impurity element to impart the n-type conductivity, and first impurity regions 5017 to 5025 are formed in a self-aligning manner. The impurity element to impart the n-type conductivity in the concentration range of $1\times10^{20}$ to $1\times10^{21}$ atoms/cm$^3$ is added to the first impurity regions 5017 to 5025. (FIG. 10B)

Next, as shown in FIG. 10C, a second etching process is performed without removing the mask formed from resist. The etching gas of the mixture of $CF_4$, $Cl_2$ and $O_2$ is used, and the W film is selectively etched. At this point, second shape conductive layers 5026 to 5031 (first conductive layers 5026*a* to 5031*a* and second conductive layers 5026*b* to 5031*b*) are formed by the second etching process. Regions of the gate insulating film 5007, which are not covered with the second shape conductive layers 5026 to 5031 are made thinner by about 20 to 50 nm by etching.

An etching reaction of the W film or the Ta film by the mixture gas of $CF_4$ and $Cl_2$ can be guessed from a generated radical or ion species and the vapor pressure of a reaction product. When the vapor pressures of fluoride and chloride of W and Ta are compared with each other, the vapor pressure of $WF_6$ of fluoride of W is extremely high, and other $WCl_5$, $TaF_5$, and $TaCl_5$ have almost equal vapor pressures. Thus, in the mixture gas of $CF_4$ and $Cl_2$, both the W film and the Ta film are etched. However, when a suitable amount of $O_2$ is added to this mixture gas, $CF_4$ and $O_2$ react with each other to form CO and F, and a large number of F radicals or F ions are generated. As a result, an etching rate of the W film having the high vapor pressure of fluoride is increased. On the other hand, with respect to Ta, even if F is increased, an increase of the etching rate is relatively small. Besides, since Ta is easily oxidized as compared with W, the surface of Ta is oxidized by addition of $O_2$. Since the oxide of Ta does not react with fluorine or chlorine, the etching rate of the Ta film is further decreased. Accordingly, it becomes possible to make a difference between the etching rates of the W film and the Ta film, and it becomes possible to make the etching rate of the W film higher than that of the Ta film.

Figures 11A, 11B, 11C:
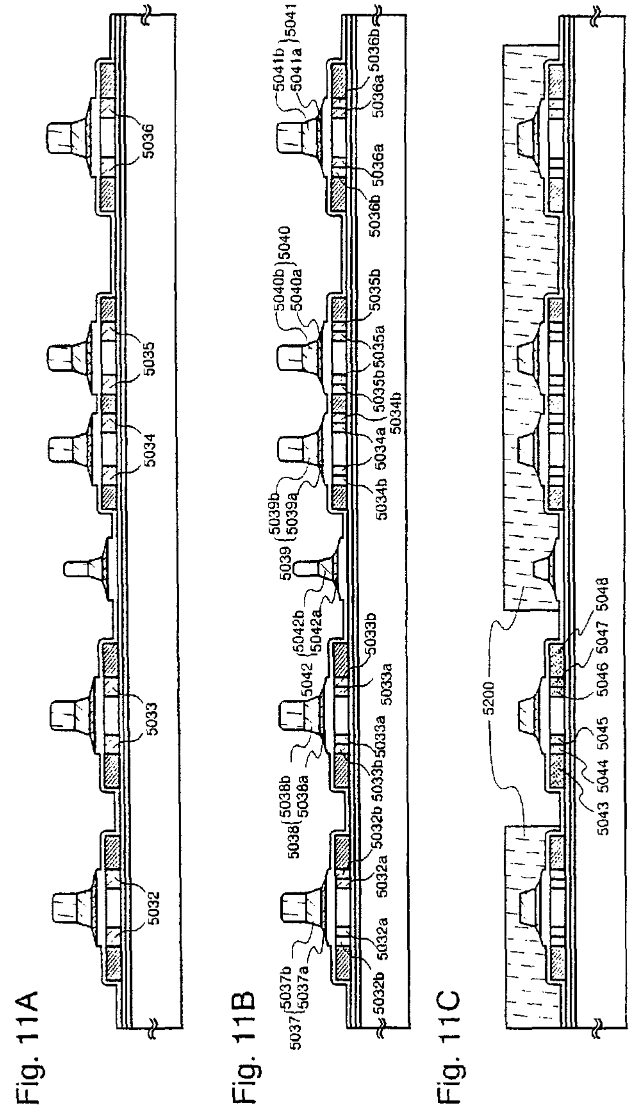
FIGS. 11A to 11C are views showing the example of the production process of the electro-optical device including the pixel of the present invention.

Then, as shown in FIG. 11A, a second doping process is performed. In this case, a dosage is made lower than that of the first doping process and under the condition of a high acceleration voltage, an impurity element for imparting the n-type conductivity is doped. For example, the process is carried out with an acceleration voltage set to 70 to 120 keV and at a dosage of $1\times10^{13}$ atoms/cm$^2$, so that new impurity regions are formed inside of the first impurity regions formed into the island-like semiconductor layers in FIG. 10B. Doping is carried out such that the second shape conductive layers 5026 to 5031 are used as masks to the impurity element and the impurity element is added also to the regions under the first conductive layers 5026*a* to 5031*a*. In this way, third impurity regions 5032 to 5036 are formed. The concentration of phosphorus (P) added to the third impurity regions has a gentle concentration gradient in accordance with the thickness of tapered portions of the first conductive layers 5026*a* to 5031*a*. Note that in the semiconductor layer that overlap with the tapered portions of the first conductive layers 5026*a* to 5031*a*, the concentration of impurity element slightly falls from the end portions of the tapered portions of the first conductive layers 5026*a* to 5031*a* toward the inner portions, but the concentration keeps almost the same level.

As shown in FIG. 11B, a third etching process is performed. This is performed by using a reactive ion etching method (RIE method) with an etching gas of $CHF_6$. The tapered portions of the first conductive layers 5026*a* to 5031*a* are partially etched, and the region in which the first conductive layers overlap with the semiconductor layer is reduced by the third etching process. Third shape conductive layers 5037 to 5042 (first conductive layers 5037*a* to 5042*a* and second conductive layers 5037*b* to 5042*b*) are formed. At this point, regions of the gate insulating film 5007, which are not covered with the third shape conductive layers 5037 to 5042 are made thinner by about 20 to 50 nm by etching.

By the third etching process, in third impurity regions 5032 to 5036, third impurity regions 3032*a* to 5036*a*, which overlap with the first conductive layers 5037*a* to 5042*a*, and second impurity regions 5032*b* to 5236*b* between the first impurity regions and the third impurity regions are formed.

Then, as shown in FIG. 11C, fourth impurity regions 5043 to 5048 having a conductivity type opposite to the first conductivity type are formed in the island-like semiconductor layer 5004 for forming P-channel TFTs. The second conductive layer 5038*b* is used as masks to an impurity element, and the impurity regions are formed in a self-aligning manner. At this time, the whole surfaces of the island-like semiconductor layers 5003, 5005 and 5006 and the wiring portion 5042, which form N-channel TFTs are covered with a resist mask 5200. Phosphorus is added to the impurity regions 5043 to 5048 at different concentrations, respectively. The regions are formed by an ion doping method using diborane ($B_2H_6$) and the impurity concentration is made $2\times10^{20}$ to $2\times10^{21}$ atoms/$cm^3$ in any of the regions.

By the steps up to this, the impurity regions are formed in the respective island-like semiconductor layers. The third shape conductive layers 5037 to 5041 overlapping with the island-like semiconductor layers function as gate electrodes. The conductive layer 5042 functions as an island-like source signal line.

After the resist mask 5200 is removed, a step of activating the impurity elements added in the respective island-like semiconductor layers for the purpose of controlling the conductivity type. This step is carried out by a thermal annealing method using a furnace annealing oven. In addition, a laser annealing method or a rapid thermal annealing method (RTA method) can be applied. The thermal annealing method is performed in a nitrogen atmosphere having an oxygen concentration of 1 ppm or less, preferably 0.1 ppm or less and at 400 to 700° C., typically 500 to 600° C. In Embodiment 4, a heat treatment is conducted at 500° C. for 4 hours. However, in the case where a wiring material used for the third conductive layers 5037 to 5042 is weak to heat, it is preferable that the activation is performed after an interlayer insulating film (containing silicon as its main ingredient) is formed to protect the wiring line or the like.

Further, a heat treatment at 300 to 450° C. for 1 to 12 hours is conducted in an atmosphere containing hydrogen of 3 to 100%, and a step of hydrogenating the island-like semiconductor layers is conducted. This step is a step of terminating dangling bonds in the semiconductor layer by thermally excited hydrogen. As another means for hydrogenation, plasma hydrogenation (using hydrogen excited by plasma) may be carried out.

Figure 12A:
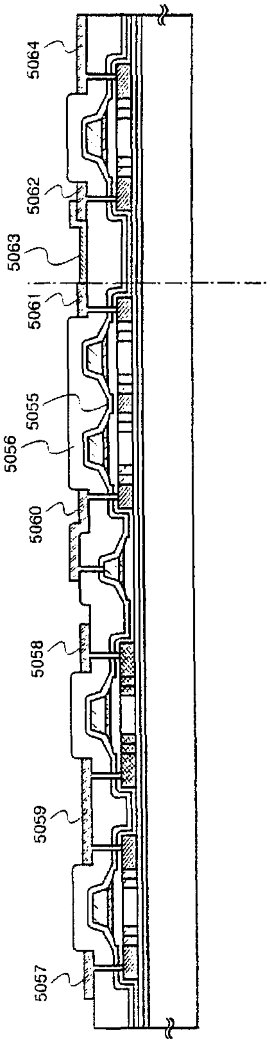
FIGS. 12A and 12B are views showing the example of the production process of the electro-optical device including the pixel of the present invention.

Next, as shown in FIG. 12A, a first interlayer insulating film 5055 having a thickness of 100 to 200 nm is formed of a silicon oxynitride film. A second interlayer insulating film 5056 made of an organic insulator material is formed thereon. Contact holes are then formed with respect to the first interlayer insulating film 5055, the second interlayer insulating film 5056, and the gate insulating film 5007, respective wirings (including connection wirings and signal lines) 5057 to 5062, and 5064 are formed by patterning, and then, a pixel electrode 5063 that contacts with the connection wiring 5062 is formed by patterning.

Next, the film made from organic resin is used for the second interlayer insulating film 5056. As the organic resin, polyimide, polyamide, acryl, BCB (benzocyclobutene) or the like can be used. Especially, since the second interlayer insulating film 5056 has rather the meaning of flattening, acryl is desirable in flatness. In Embodiment 4, an acryl film is formed to such a thickness that stepped portions formed by the TFTs can be adequately flattened. The thickness is preferably made 1 to 5 μm (more preferably 2 to 4 μm).

In the formation of the contact holes, dry etching or wet etching is used, and contact holes reaching the n-type impurity regions 5017, 5018, 5021 and 5023 to 5025 or the p-type impurity regions 5043 to 5048, a contact hole reaching the wiring 5042, a contact hole reaching the power source supply line (not shown), and contact holes reaching the gate electrodes (not shown) are formed, respectively.

Further, a lamination film of a three layer structure, in which a 100 nm thick Ti film, a 300 nm thick aluminum film containing Ti, and a 150 nm thick Ti film are formed in succession by sputtering, is patterned into a desirable shape, and the resultant lamination film is used as the wirings (including connection wirings and signal lines) 5057 to 5062, and 5064. Of course, other conductive films may be used.

Furthermore, in Embodiment 4, a MgAg film is formed with a thickness of 110 nm, and patterning is performed to form the pixel electrode 5063. The pixel electrode 5063 is arranged so as to contact and overlap the connection wiring 5062 so that contact is obtained. This pixel electrode 5063 corresponds to an anode of an EL element. (FIG. 12A)

Figure 12B:
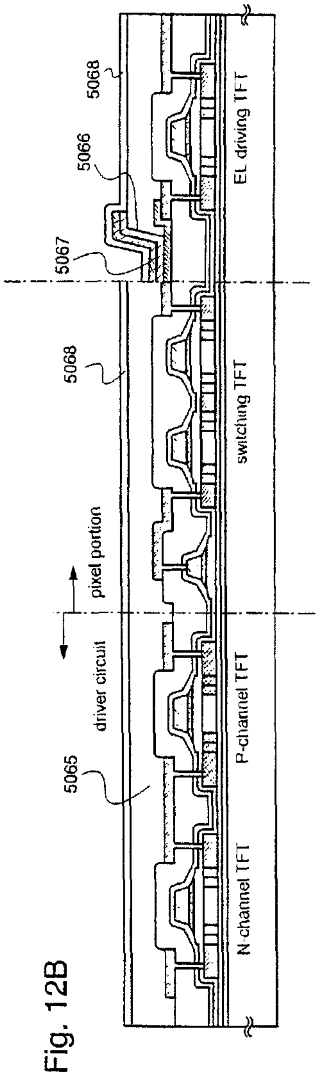
Figure 13:
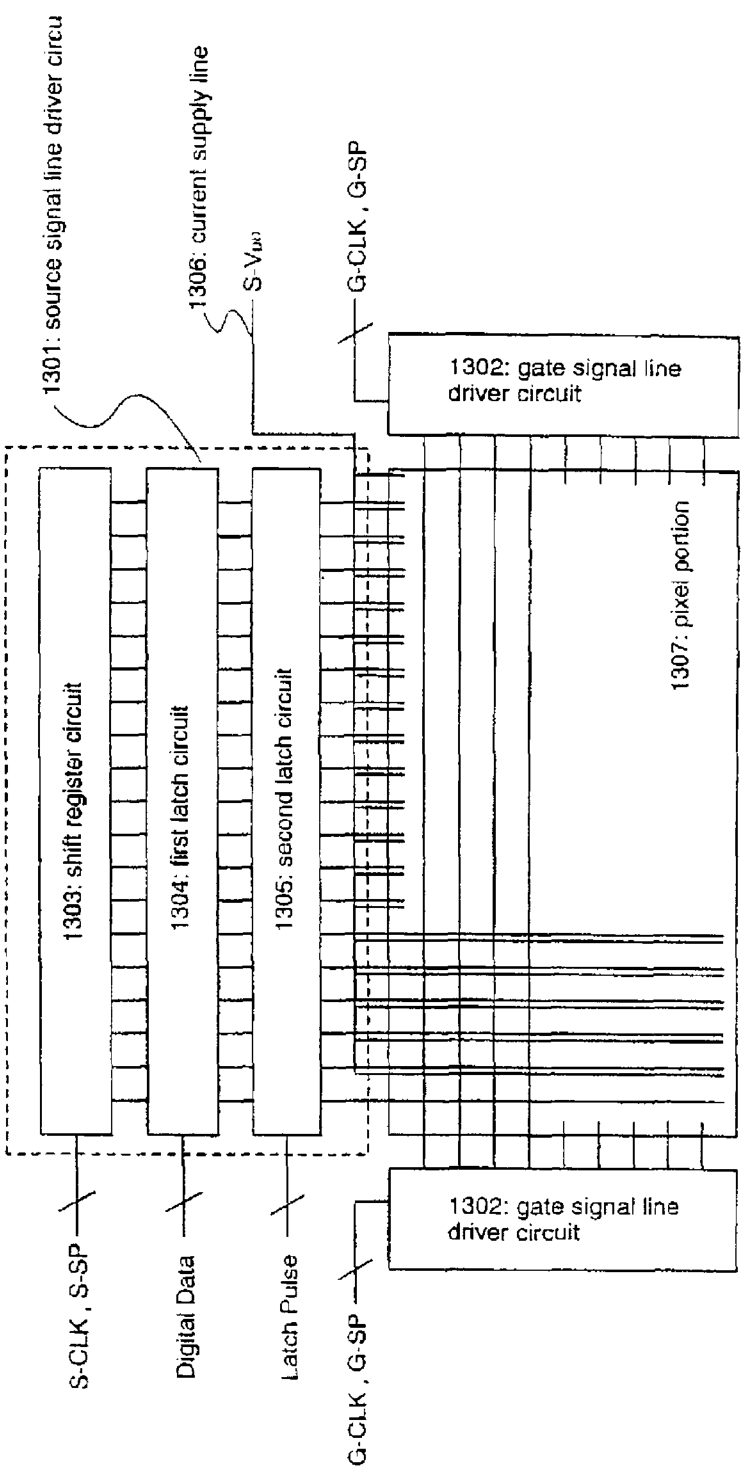
Fig. 13 Prior Art
FIG. 13 is a view schematically showing the whole circuit structure of a conventional electro-optical device.
Figure 14:
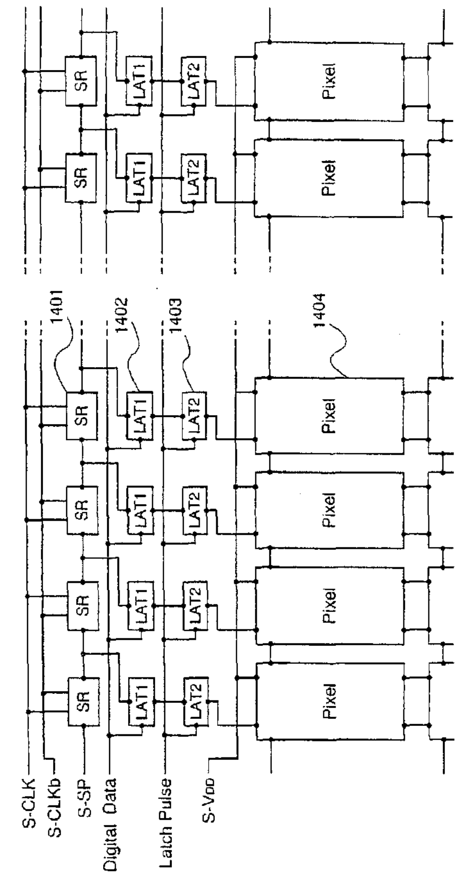
Fig. 14 Prior Art
FIG. 14 is a view showing a circuit structural example of a source signal line driver circuit of the conventional electro-optical device.

Nest, as shown in FIG. 12B, an insulating film containing silicon (a silicon oxide film in Embodiment 4) is formed with a thickness of 500 nm, an opening portion is formed at the position corresponding to the pixel electrode 5063, and then, a third interlayer insulating film 5065 that functions as a bank is formed. In forming the opening portion, side walls having a tapered shape may be easily formed by using wet etching. The deterioration of the EL layer due to stepped portion becomes a remarkable problem if the side walls of the opening portion are sufficiently flat.

An EL layer 5066 and a cathode (transparent electrode) 5067 are formed next in succession, without exposure to the atmosphere, using a vacuum evaporation method. Note that the film thickness of the EL layer 5066 may be set from 80 to 200 nm (typically between 100 and 120 nm), and the thickness of the cathode 5067 is formed from ITO film.

The EL layer and the cathode are formed one after another with respect to pixels corresponding to the color red, pixels corresponding to the color green, and pixels corresponding to the color blue. However, the EL layer is weak with respect to a solution, and therefore the EL layer and the cathode must be formed with respect to each of the colors without using a photolithography technique. It is preferable to cover areas outside of the desired pixels using a metal mask, and selectively form the EL layer and the cathode only in the necessary locations.

In other words, a mask is first set so as to cover all pixels except for those corresponding to the color red, and the EL layer for emitting red color light is selectively formed using the mask. Next, a mask is set so as to cover all pixels except for those corresponding to the color green, and the EL layer for emitting green color light is selectively formed using the mask. Similarly, a mask is set so as to cover all pixels except for those corresponding to the color blue, and the EL layer for emitting blue color light is selectively formed using the mask. Note that the use of all different masks is stated here, but the same mask may also be reused.

The method of forming three kinds of EL elements corresponding to the colors RGB is used here, but a method of combining a white color tight emitting EL element and a color filter, a method of combining a blue or blue-green color light emitting EL element and a fluorescing body (fluorescing color conversion layer: CCM), a method of using a transparent electrode as a cathode (opposing electrode) and overlapping it with EL elements each corresponding to one of the colors RGB and the like may be used.

A known material can be used as the EL layer 5066. Considering the driver voltage, it is preferable to use an organic material as the known material. For example, a four layer structure constituted of a hole injecting layer, a hole transporting layer, a light emitting layer and an electron injecting layer may be adopted as an EL layer.

Next, the cathode 5067 is formed using a metal mask on the pixels having the switching TFTs of which the gate electrodes are connected to the same gate signal line (pixels on the same line). Note that, in Embodiment 4, although MgAg is used as the cathode 5067, the present invention is not limited to this. Other known materials may be used for the cathode 5067.

Finally, a passivation film 5068 made of a silicon nitride film is formed with a thickness of 300 nm. The formation of the passivation film 5068 enables the EL layer 5066 to be protected against moisture and the like, and the reliability of the EL element can further be enhanced.

Consequently, the EL display panel with the structure as shown in FIG. 12B is completed. Note that, in the manufacturing process of the EL display in Embodiment 4, the source signal lines are formed from Ta and W, which are materials for forming gate electrodes, and the gate signal lines are formed from Al, which is a material for forming wirings, but different materials may be used.

TFT in the active matrix type electro optical device formed by the above mentioned steps has a top gate structure, but this embodiment can be easily applied to bottom gate structure TFT and other structure TFT.

Further, the glass substrate is used in this embodiment, but it is not limited. Other than glass substrate, such as the plastic substrate, the stainless substrate and the single crystalline wafers can be used to implement.

Incidentally, the EL display panel in Embodiment 4 exhibits the very high reliability and has the improved operational characteristic by providing TFTs having the most suitable structure in not only the pixel portion but also the driver circuit portion. Further, it is also possible to add a metallic catalyst such as Ni in the crystallization process, thereby increasing crystallinity. It therefore becomes possible to set the driving frequency of the source signal line driver circuit to 10 MHz or higher.

First, a TFT having a structure in which hot carrier injection is reduced without decreasing the operating speed as much as possible is used as an N-channel TFT of a CMOS circuit forming the driver circuit portion. Note that the driver circuit referred to here includes circuits such as a shift register, a buffer, a level shifter, a latch in line-sequential drive, and a transmission gate in dot-sequential drive.

In Embodiment 4, the active layer of the N-channel TFT contains the source region, the drain region, the LDD (lightly doped drain) region overlapping with the gate electrode with the gate insulating film sandwiched therebetween (Lov region), the LDD region not overlapping with the gate electrode with the gate insulating film sandwiched therebetween (Loff region), and the channel forming region.

Further, there is not much need to worry about degradation due to the hot carrier injection with the P-channel TFT of the CMOS circuit, and therefore LDD regions may not be formed in particular. It is of course possible to form LDD regions similar to those of the N-channel TFT, as a measure against hot carriers.

In addition, when using a CMOS circuit in which electric current flows in both directions in the channel forming region, namely a CMOS circuit in which the roles of the source region and the drain region interchange, it is preferable that LDD regions be formed on both sides of the channel forming region of the N-channel TFT forming the CMOS circuit, sandwiching the channel forming region. A circuit such as a transmission gate used in dot-sequential drive can be given as an example of such. Further, when a CMOS circuit in which it is necessary to suppress the value of the off current as much as possible is used, the N-channel TFT forming the CMOS circuit preferably has an Lov region. A circuit such as the transmission gate used in dot-sequential drive can be given as an example of such.

Note that, in practice, it is preferable to perform packaging (sealing), without exposure to the atmosphere, using a protecting film (such as a laminated film or an ultraviolet cured resin film) having good airtight properties and little out gassing, or a transparent sealing material, after completing through the state of FIG. 12B. At this time, the reliability of the EL element is increased by making an inert atmosphere on the inside of the sealing material and by arranging a drying agent (barium oxide, for example) inside the sealing material.

Further, after the airtight properties have been increased by the packaging process, a connector (flexible printed circuit: FPC) is attached in order to connect terminals led from the elements or circuits formed on the substrate with external signal terminals. Then, a finished product is completed. This state at which the product is ready for shipment is referred to as an electro optical device throughout this specification.

Furthermore, in accordance with the process shown in Embodiment 4, the number of photo masks required for manufacture of an electro optical device can be suppressed. As a result, the process can be shortened, and the reduction of the manufacturing cost and the improvement of the yield can be attained.

EMBODIMENT 5

Figure 9:
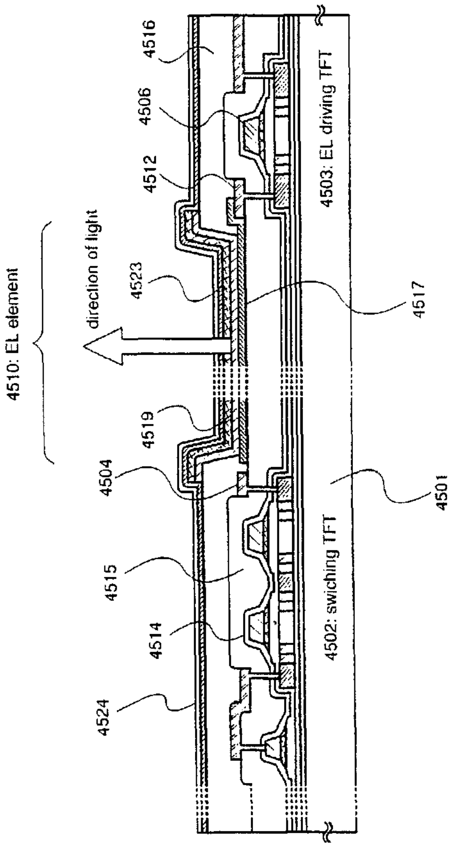
FIG. 9 is a view showing a section of an electro-optical device having a structure of an EL element which emits light in a direction different from an electro-optical device shown in FIGS. 10A to 12B.

Here, FIG. 9 shows a more detailed sectional structure of a pixel portion of an electro optical device in accordance with the present invention.

In FIG. 9, a switching TFT 4502 provided on a substrate 4501 is formed by using an N-channel TFT in accordance with Embodiment 5. In this embodiment, although a double gate structure is used, since there is no big difference in the structure and fabricating process, explanation is omitted. However, a structure in which two TFTs are substantially connected in series with each other is obtained by adopting the double gate structure, and there is a merit that an off current value can be decreased. Note that although the double gate structure is adopted in this embodiment, a single gate structure may be adopted, or a triple gate structure or a multi-gate structure having more gates may be adopted. Further, it may be formed by using a P-channel TFT.

Further, an EL driving TFT 4503 is formed by using an N-channel TFT. A drain wiring 4504 of the switching TFT 4502 is electrically connected to a gate electrode 4506 of the EL driving TFT 4503 through a wiring (not shown in figure).

In a case where a driving voltage of the electro optical device is high (10V or more), a driver circuit TFT, in particular an N-channel TFT, has high fear of deterioration due to hot carriers or the like. Thus, it is very effective to adopt a structure in which an LDD region (GOLD (gate overlapped lightly doped) region) is provided at a drain side of the N-channel TFT, or at source and drain sides so as to overlap with a gate electrode through a gate insulating film. In a case where a driving voltage is low (10 V or less), there is no fear of deterioration due to hot carrier so that there is no need to provide a GOLD region. However, with respect to the switching TFT 4502 in a pixel portion, it is very effective to adopt a structure in which an LDD region is provided at a drain side of the N-channel TFT, or at source and drain sides so as not to overlap with a gate electrode through a gate insulating film to reduce an off-current. At this time, with respect to the EL driving TFT 4503, there is no need to provide an LDD region, however, a private (dedicated) mask is necessary to cover the portion of the EL driving TFT 4503 with a resist when an LDD region is formed in the switching TFT 4502. Therefore, in Embodiment 5, the EL driving TFT 4503 is formed with the same structure as that of the switching TFT 4502 to reduce the mask number.

In this embodiment, although the EL driving TFT 4503 is shown as a single gate structure, a multi-gate structure in which a plurality of TFTs are connected in series with each other may be adopted. Further, such a structure may be adopted that a plurality of TFTs are connected in parallel with each other to substantially divide a channel forming region into plural portions, so that radiation of heat can be made at high efficiency. Such structure is effective as a countermeasure against deterioration due to heat.

Further, the wiring (not shown in figure) including the gate electrode 4506 of the EL driving TFT 4503 partly overlaps with a drain wiring 4512 of the EL driving TFT 4503 through an insulating film, and a storage capacitor is formed in the region. The storage capacitor functions to store a voltage applied to the gate electrode 4506 of the EL driving TFT 4503.

A first interlayer insulating film 4514 is provided on the switching TFT 4502 and the EL driving TFT 4503, and a second interlayer insulating film 4515 made of a resin insulating film is formed thereon.

Reference numeral 4517 designates a pixel electrode (cathode of the EL element) made of a conductive film having high reflectivity. The pixel electrode is formed to overlap partly with a drain region of the EL driving TFT 4503 and electrically connected to the drain region. As the pixel electrode 4517, it is preferable to use a low resistance conductive film, such as an aluminum alloy film, a copper alloy film or a silver alloy film, or a lamination film of those. Of course, a laminate structure with another conductive film may be adopted.

Then, an organic resin film 4516 is formed on the pixel electrode 4517 and the portion which faces to the pixel electrode 4517 is patterned to form an EL layer 4519. Herein, although not shown in figure, light-emitting layers corresponding to each color of R (red), G (green), and B (blue) may be formed. As an organic EL material used for the light-emitting layer, a π-conjugate polymer material is used. Typical examples of the polymer material include polyparaphenylene vinylene (PPV), polyvinyl carbazole (PVK), and polyfluorene.

Further, it is possible that the arrangement of TFT right under the area where the luminescence layer is formed, by adding one more layer of the insulating film between the second interlayer insulating film 4515 and the organic resin film 4516. Therefore the large luminescence layer can be arranged also when the occupation area of the driving TFT increase.

Although various types exist as the PPV typed organic EL material, for example, a material as disclosed in "H. Shenk, H. Becker, O Gelsen, E. Kluge, W. Kreuder, and H. Spreitzer, "Polymers for Light Emitting Diodes", Euro Display, Proceedings, 1999, p. 33-37" or Japanese Patent Application Laid-open No. Hei. 10-92576 may be used.

As a specific light emitting layer, it is appropriate that cyanopolyphenylene vinylene is used for a light emitting layer emitting red light, polyphenylenevinylene is used for a light emitting layer emitting green light, and polyphenylenevinylene or polyalkylphenylene is used for a light emitting layer emitting blue light. It is appropriate that the film thickness is made 30 to 150 nm (preferably 40 to 100 nm).

However, the above examples are an example of the organic EL material which can be used for the light emitting layer, and it is not necessary to limit the invention to these. The EL layer (layer in which light emission and movement of carriers for that are performed) may be formed by freely combining a light emitting layer, a charge transporting layer and a charge injecting layer.

For example, although this embodiment shows the example in which the polymer material is used for the light emitting layer, a low molecular organic EL material may be used. It is also possible to use an inorganic material such as silicon carbide, as the charge transporting layer or the charge injecting layer. As the organic EL material or inorganic material, a well-known material can be used.

At the point when the anode 4523 was formed, an EL element 4510 is completed. Incidentally, the EL element 4510 here indicates a storage capacitor formed of the pixel electrode (cathode) 4517, the light emitting layer 4519, the anode 4523 and the storage capacitor (not illustrated).

In this embodiment, a passivation film 4524 is further provided on the anode 4523. As the passivation film 4524, a silicon nitride film or a silicon oxynitride film is desirable. This object is to insulate the EL element from the outside, and has both meaning of preventing deterioration due to oxidation of the organic EL material and suppressing degassing from the organic EL material. By doing this, reliability of the electro optical device is improved.

As described above, the electro optical device described in the Embodiment 5 includes the switching TFT having a sufficiently low off current value and the EL driving TFT resistant to hot carrier injection. Thus, it is possible to obtain the electro optical device which has high reliability and can make excellent image display.

In the case of an EL element having the structure described in Embodiment 5, light generated in the light emitting layer 4519 is radiated to reverse direction to the substrate on which TFTs are formed as indicated by an arrow. Therefore if the number of elements which is structuring the pixel portion is increased, it is efficient to apply the electro optical device to the present invention, because there is no need to worry about a reduction of aperture ratio.

EMBODIMENT 6

Although the pixel portion of the electro-optical device of the present invention described in the embodiments 1 to 3 is constructed by using the static memory (Static RAM: SRAM) as the memory circuit, the memory circuit is not limited to only the SRAM. As a memory circuit applicable to the pixel portion of the electro-optical device of the present invention, a dynamic memory (Dynamic RAM: DRAM) and the like can be cited. In this embodiment, an example in which a circuit is constructed by using such memory circuits will be described.

Figure 8:
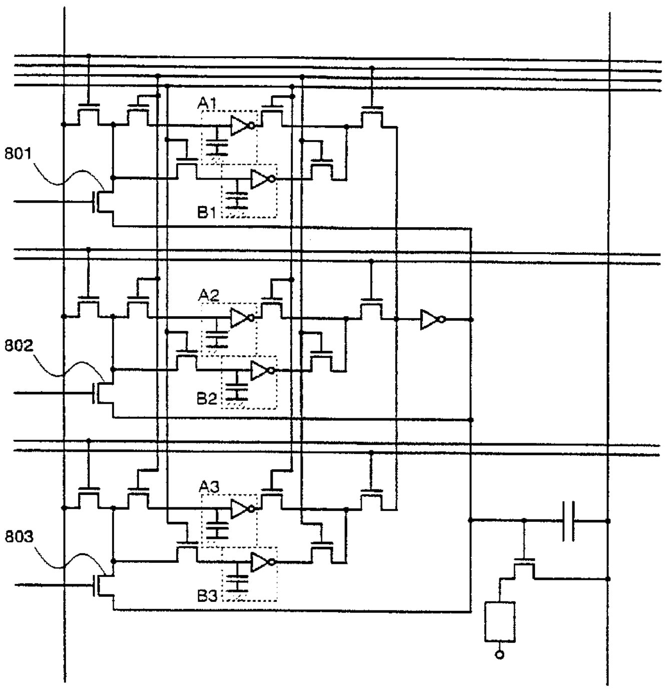
FIG. 8 is a detailed circuit diagram of a pixel of the present invention in the case where a dynamic memory is used for a memory circuit.

FIG. 8 shows an example in which DRAMs are used for memory circuits A1 to A3 and B1 to B3 arranged in a pixel. The basic structure is the same as the circuit shown in the embodiment 1. With respect to the DRAMs used for the memory circuits A1 to A3 and B1 to B3, general structure ones may be used. In this embodiment, a simple structure DRAM constituted by an inverter and a capacitance is used and is shown.

The operation of the source signal line driver circuit is the same as that of the embodiment 1. Here, differently from the SRAM, in the case of the DRAM, since rewriting into the memory circuit (hereinafter, this operation is expressed as refresh) is required for every certain period, refreshing TFTs 801 to 803 are included. The refresh is carried out in such a manner that the refreshing TFTs 801 to 803 are respectively turned on at a certain timing of a period in which a still picture is displayed (period in which digital image signals stored in the memory circuits are repeatedly read out and a display is carried out), and electric charges in the pixel portion are fed back to the side of the memory circuits.

Further, although particularly not shown, as another type memory circuit, the pixel portion of the electro-optical device of the present invention can be constructed by using a ferroelectric memory (Ferroelectric RAM: FeRAM). The FeRAM is a nonvolatile memory having a writing speed equivalent to the SRAM or the DRAM, and by using its feature of low writing voltage and so one, the electric power consumption of the electro-optical device of the present invention can be further reduced. Besides, in addition, the pixel portion can also be constructed by flash memories or the like.

EMBODIMENT 7

An active matrix semiconductor display device made from a driver circuit of the present invention has various uses. In the present embodiment, a description will be given on an electronic device incorporating a display device made from a driver circuit of the present invention.

The following can be given as examples of these display devices: a portable information terminal (such as an electronic book, a mobile computer, and a portable telephone), a video camera, a digital camera, a personal computer and a television. Examples of those are shown in FIGS. 15 and 16.

Figure 15A:
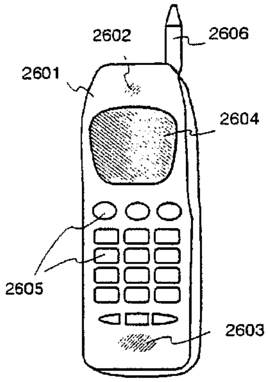
FIGS. 15A to 15F are views showing examples of electronic instruments to which a display device including a pixel of the present invention can be applied.

FIG. 15A is a portable telephone, and is composed of a main body 2601, an audio output portion 2602, an audio input portion 2603, a display portion 2604, operation switches 2605, and an antenna 2606. The present invention can be applied to the display portion 2604.

Figure 15B:
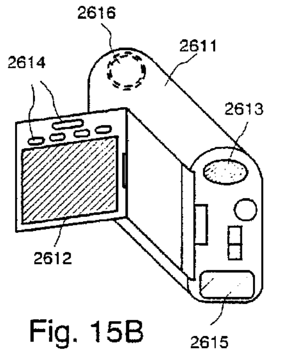

FIG. 15B is a video camera, and is composed of a main body 2611, a display portion 2612, an audio input portion 2613, operation switches 2614, a battery 2615, and an image receiving portion 2616. The present invention can be applied to the display portion 2612.

Figure 15C:
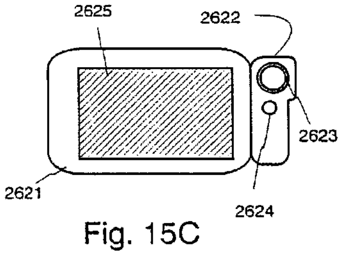

FIG. 15C is a mobile computer or a portable type information terminal, and is composed of a main body 2621, a camera portion 2622, an image receiving portion 2623, operation switches 2624, and a display portion 2625. The present invention can be applied to the display portion 2625.

Figure 15D:
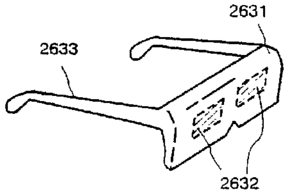

FIG. 15D is a head mount display, and is composed of a main body 2631, a display portion 2632, and an arm portion 2633. The present invention can be applied to the display portion 2632

Figure 15E:
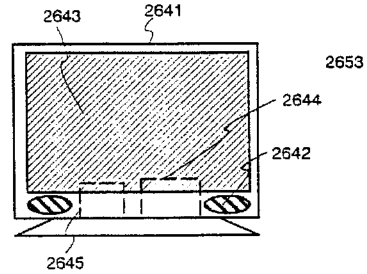

FIG. 15E is a television, and is composed of a main body 2641, speakers 2642, a display portion 2643, a receiving device 2644, and an amplification device 2645. The present invention can be applied to the display portion 2643.

Figure 15F:
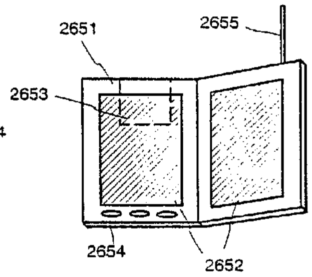

FIG. 15F is a portable electronic book, and is composed of a main body 2651, a display device 2652, a memory medium 2653, an operation switch 2654 and an antenna 2655. The book is used to display data stored in a mini-disk (MD) or a DVD (Digital Versatile Disk), or a data received with the antenna. The present invention can be applied to the display portion 2652.

Figure 16A:
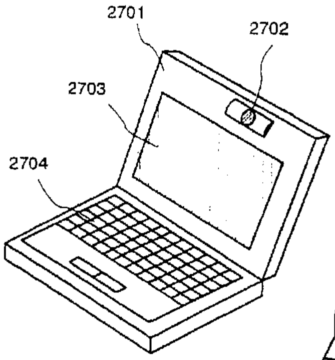
FIGS. 16A to 16D are views showing examples of electronic instruments to which a display device including a pixel of the present invention can be applied.

FIG. 16A is a personal computer, and is composed of a main body 2701, an image inputting portion 2702, a display device 2703 and a keyboard 2704. The present invention can be applied to the display portion 2703 prepared with an active matrix substrate.

Figure 16B:
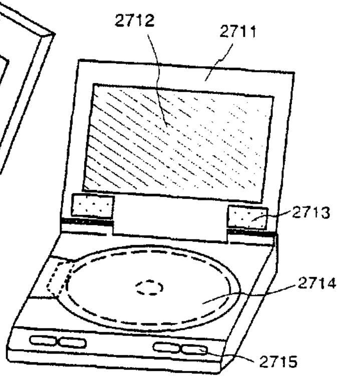

FIG. 16B is a player that employs a recording medium in which programs are recorded, and is composed of a main body 2711, a display portion 2712, a speaker portion 2713, a recording medium 2714, and an operation switch 2715. Note that this player uses a DVD (Digital Versatile Disc), CD and the like as the recording medium to appreciate music and films, play games, and connect to the Internet. The present invention can be applied to the display portion 2612.

Figure 16C:
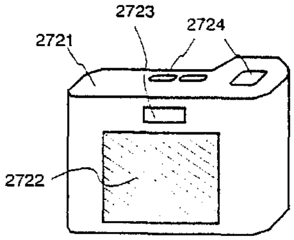

FIG. 16C is a digital camera comprising a main body 2721, a display portion 2722, an eye piece 2723, operation switches 2724, and an image receiving portion (not shown in the figure). The present invention can be applied to the display portion 2722.

Figure 16D:
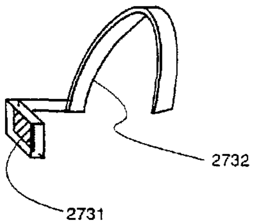

FIG. 16D is an one-eyed head mount display comprising a display portion 2731, and a band portion 2732. The present invention can be applied to the display portion 2731.

As described above, according to the present invention, digital image signals are stored by using a plurality of memory circuits arranged in the inside of each pixel, so that the digital image signals stored in the memory circuits are repeatedly used in each frame period when a still picture is displayed, and when a still picture display is continuously carried out, it becomes possible to keep a source signal line driver circuit stopped. Thus, the invention can greatly contribute to the reduction in electric power consumption of the whole electro-optical device.

What is claimed is:

1. A light-emitting device comprising:
   - a plurality of pixels formed over a substrate, each of the plurality of pixels including n×m memory circuits for storing n-bit digital image signals for m frame periods, wherein the n is a natural number of 2 or more, and the m is 2;
   - n latch circuits in one column;
   - n source signal lines in the one column, each electrically connected to each of the n latch circuits; and
   - one writing gate signal line in one of the plurality of pixels, electrically connected to gates of n writing transistors,
   - wherein periods for emitting light from the plurality of pixels in one frame period among the m frame periods are divided to $2^{(n-1)}, 2^{(n-2)}, \ldots, 2^0$ with the n-bit digital image signals, and
   - wherein a gradation of the light-emitting device is configured to be expressed by combining the periods in the one frame period.

2. A light-emitting device according to claim 1, wherein the substrate is one selected from the group consisting of a glass substrate, a plastic substrate, a stainless substrate, and a single crystalline wafer.

3. A light-emitting device according to claim 1, wherein the light-emitting device is an EL display device.

4. A light emitting device according to claim 1, wherein the light-emitting device is incorporated in one selected from the group consisting of a camera, a computer, a telephone, a head mount display, and an electronic book.

5. A light-emitting device according to claim 1, wherein the memory circuits are one selected from the group consisting of a SRAM, FeRAM, a DRAM and a flash memory.

6. A light-emitting device comprising:

a plurality of pixels formed over a substrate, each of the plurality of pixels including n×m memory circuits for storing n-bit digital image signals for m frame periods, wherein the n is a natural number of 2 or more, and the m is 2;

n latch circuits in one column;

n source signal lines in the one column, each electrically connected to each of the n latch circuits; and n reading gate signal lines in one of the plurality of pixels, each electrically connected to each gate of n reading transistors, wherein periods for emitting light from the plurality of pixels in one frame period among the m frame periods are divided to $2^{(n-1)}$, $2^{(n-2)}$, . . . , $2^0$ with the n-bit digital image signals, and wherein a gradation of the light-emitting device is configured to be expressed by combining the periods in the one frame period.

7. A light-emitting device according to claim 6, wherein the substrate is one selected from the group consisting of a glass substrate, a plastic substrate, a stainless substrate, and a single crystalline wafer.

8. A light-emitting device according to claim 6, wherein the light-emitting device is an EL display device.

9. A light emitting device according to claim 6, wherein the light-emitting device is incorporated in one selected from the group consisting of a camera, a computer, a telephone, a head mount display, and an electronic book.

10. A light-emitting device according to claim 6, wherein the memory circuits are one selected from the group consisting of a SRAM, FeRAM, a DRAM and a flash memory.

11. A light-emitting device comprising:

a plurality of pixels formed over a substrate, each of the plurality of pixels including n×m memory circuits for storing n-bit digital image signals for m frame periods, wherein the n is a natural number of 2 or more, and the m is 2;

n latch circuits in one column;

n source signal lines in the one column, each electrically connected to each of the n latch circuits;

one writing gate signal line in one of the plurality of pixels, electrically connected to gates of n writing transistors; and n reading gate signal lines in the one of the plurality of pixels, each electrically connected to each gate of n reading transistors, wherein periods for emitting light from the plurality of pixels in one frame period among the m frame periods are divided to $2^{(n-1)}$, $2^{(n-2)}$, . . . , $2^0$ with the n-bit digital image signals, and wherein a gradation of the light-emitting device is configured to be expressed by combining the periods in the one frame period.

12. A light-emitting device according to claim 11, wherein the substrate is one selected from the group consisting of a glass substrate, a plastic substrate, a stainless substrate, and a single crystalline wafer.

13. A light-emitting device according to claim 11, wherein the light-emitting device is an EL display device.

14. A light emitting device according to claim 11, wherein the light-emitting device is incorporated in one selected from the group consisting of a camera, a computer, a telephone, a head mount display, and an electronic book.

15. A light-emitting device according to claim 11, wherein the memory circuits are one selected from the group consisting of a SRAM, FeRAM, a DRAM and a flash memory.

* * * * *